(12) United States Patent
Nuriya et al.

(10) Patent No.: US 9,730,349 B2
(45) Date of Patent: Aug. 8, 2017

(54) WATERPROOF-TYPE CONTROL UNIT AND ASSEMBLY METHOD THEREOF

(71) Applicant: Mitsubishi Electric Corporation, Tokyo (JP)

(72) Inventors: Nobuaki Nuriya, Tokyo (JP); Mitsunori Nishida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/131,080

(22) Filed: Apr. 18, 2016

(65) Prior Publication Data

US 2017/0112011 A1 Apr. 20, 2017

(30) Foreign Application Priority Data

Oct. 16, 2015 (JP) .................... 2015-204944

(51) Int. Cl.
| | | |
|---|---|---|
| H05K 7/00 | (2006.01) | |
| H05K 5/03 | (2006.01) | |
| H05K 5/00 | (2006.01) | |
| H05K 5/06 | (2006.01) | |
| H05K 1/18 | (2006.01) | |
| H05K 7/14 | (2006.01) | |

(52) U.S. Cl.
CPC ............. *H05K 5/03* (2013.01); *H05K 1/181* (2013.01); *H05K 5/0017* (2013.01); *H05K 5/065* (2013.01); *H05K 7/1422* (2013.01)

(58) Field of Classification Search
CPC ........ H05K 1/181; H05K 5/03; H05K 5/0017; H05K 5/065; H05K 7/1422

USPC .................. 361/728–730, 752, 757, 816, 818
See application file for complete search history.

(56) References Cited

U.S. PATENT DOCUMENTS

| 7,144,275 | B2 * | 12/2006 | Iida ........................ | H05K 5/062 |
| | | | | 439/587 |
| 7,936,566 | B2 * | 5/2011 | Shigyo ................ | H05K 5/0052 |
| | | | | 137/14 |
| 8,014,158 | B2 * | 9/2011 | Kojima ................ | H05K 5/0052 |
| | | | | 174/50.5 |
| 8,520,397 | B2 * | 8/2013 | Azumi ................ | H05K 5/0052 |
| | | | | 361/730 |
| 8,727,794 | B2 * | 5/2014 | Tanaka ................ | H05K 5/0039 |
| | | | | 361/752 |
| 9,013,889 | B2 * | 4/2015 | Tamura ................ | H05K 5/0052 |
| | | | | 361/752 |
| 9,462,715 | B2 * | 10/2016 | Nuriya .................. | H05K 5/061 |
| 2015/0216070 | A1 * | 7/2015 | Nuriya ................ | B32B 37/0076 |
| | | | | 361/752 |

(Continued)

FOREIGN PATENT DOCUMENTS

| JP | 2012-69611 A | 4/2012 |
| JP | 2013-69735 A | 4/2013 |

*Primary Examiner* — Hung S Bui
(74) *Attorney, Agent, or Firm* — Sughrue Mion, PLLC; Richard C. Turner

(57) ABSTRACT

Upon disposing the connector housing, thinning of the waterproof sealing material due to scraping is compensated by a replenishing end section of waterproof sealing material that is applied to the replenishing inclined surface sections. As a result, sealing performance is improved while allowing for a simple mold construction of the connector housing and the cover without the need for auxiliary seal grooves.

8 Claims, 18 Drawing Sheets

(56) References Cited

U.S. PATENT DOCUMENTS

2016/0113137 A1* 4/2016 Nuriya ............... H01R 13/5202
                                                        361/728

* cited by examiner

WATERPROOF-TYPE CONTROL UNIT AND ASSEMBLY METHOD THEREOF

TECHNICAL FIELD

The present invention relates to a waterproof-type control unit, which is an on-board electronic control device disposed, for instance, in an engine room, and to an assembly method of the waterproof-type control unit.

BACKGROUND ART

Waterproof-type control units are widely used that comprise: a casing made up of a base and a cover; a circuit board that is hermetically accommodated in the casing; a circuit component and a plurality of contact terminals for external connection, mounted on the circuit board; and a connector housing having a partition wall into which the contact terminals are press-fitted; wherein in order to expose the end face of the connector housing out of the casing there is provided a waterproof sealing material that fills a first sealing gap provided at an abutment surface of the connector housing and the cover, a second sealing gap provided at an abutment surface of the connector housing and the base, and a third sealing gap provided at an abutment surface of the base and the cover.

In the sealing structure for an electronic control device in Japanese Patent Application Publication No. 2013-069735 (FIG. 1 and FIG. 8), for instance, a casing seal portion 50A is provided on a joining surface of peripheral edges of a cover 13 and a case (corresponding to the base of the present application) 12 that clamp a connector (corresponding to the connector housing of the present application) 15; a connector seal portion 50B is provided at a joining surface of the outer peripheral surface of the connector 15 and the inner peripheral face of the casing; a seal groove 51 is provided on one of the seal portions 50A, 50B, and a ridge is provided on the other; a gap having a U-shaped cross-section, between the seal groove 51 and the ridge, is filled with a sealant (corresponding to the waterproof sealing material of the present application); and an auxiliary seal groove 58 and an auxiliary ridge 59 that fit into each other are provided, across a predetermined gap, at the opposing surfaces of the seal groove 51 and the ridge, at a joint portion at which the two seal portions 50A, 50B intersect at a predetermined angle. As a result, a sealing structure is provided in which there is suppressed loss of sealability at the joint portion between the casing seal portion and the connector seal portion.

In the waterproof-type electronic apparatus and assembly method thereof of Japanese Patent Application Publication No. 2012-069611 (paragraph [0047], FIG. 7 and FIG. 12), an end section of a recessed stripe on a base 200 side and an end section of a recessed stripe on a cover 400 side are formed in wide recesses 230d1, 230d2 and 420c1, 420c2, at intersections C1, C2. These wide recesses are utilized as fused portions of the sealing material 500 with which a first seal portion and a second seal portion is coated; thereby, a gapless sealing process can be carried out in which a fusion surface area is expanded while causing excess sealing material that arises at a fusion point of a non-annular sealing material and an annular sealing material to be engulfed into the opposing wide recess.

Further, Japanese Patent Application Publication No. 2012-069611 discloses (FIG. 17, FIG. 18, paragraph [0004]) a first assembly method and a second assembly method as methods for assembling a waterproof-type electronic apparatus, wherein the first assembly method involves coating firstly a second sealing gap surface of a base with a waterproof sealing material; arranging next, on the base, a circuit board having a connector housing mounted thereon; coating next a first sealing gap of the connector housing and a third sealing gap of the base with waterproof sealing material, in a ring-like fashion; and attaching and fastening next the cover. The second assembly method involves coating firstly a first sealing gap surface of a base with a waterproof sealing material; arranging next, on the cover, a circuit board having a connector housing mounted thereon; coating next a second sealing gap of the connector housing and the third sealing gap of the base with waterproof sealing material, in a ring-like fashion; and attaching and fastening next the base.

CITATION LIST

Patent Literature

[PTL 1] Japanese Patent Application Publication No. 2013-069735 (FIG. 1, FIG. 8, Abstract, paragraphs [0016] and [0018])

[PTL 2] Japanese Patent Application Publication No. 2012-069611 (FIG. 5, Abstract, paragraph [0047], FIG. 17, FIG. 18, paragraph [0066])

SUMMARY OF INVENTION

Technical Problem (1) Explanation of the Problems of the Conventional Art

In the "sealing structure of a electronic control device" of Japanese Patent Application Publication No. 2013-069735, a seal groove and an auxiliary seal groove are provided at the lower portion of trapezoid oblique side sections of a connector housing, the end face of which takes on a trapezoid shape, and a ridge and an auxiliary ridge are provided on the inner surface of an opposing cover, to improve thereby the sealing performance of the joint portion of the sealing material. However, a problem arises in that when a plurality of seal grooves are provided in trapezoid oblique side sections of the connector housing, the connector housing takes on a long-bodied dimension, and it is difficult to configure the cover, being a mating member, in the form of a sheet metal structure. According to the disclosure in paragraph [0018], the cover is made up of a synthetic resin material.

In paragraph [0021], the casing seal portion 50A is configured through application of a sealant, in an endless annular fashion, onto the seal groove 51 that is provided in the outer periphery of a case 12, the connector seal portion 50B is configured through application of a sealant, in an endless annular fashion, also onto the seal groove 51 provided in the outer periphery of the connector 15, The casing seal portion 50A and the connector seal portion 50B are then connected integrally to each other at the lower portion of the connector 15.

In the lower portion of the trapezoid oblique side, therefore, the sealant of the upper portion of the trapezoid oblique side sections of the connector 15 becomes scraped off upon attachment of the cover 13, even though the sealing performance is enhanced by the auxiliary seal groove; as a result, the sealant on the short top side is thinned out, and it becomes difficult to exert the original pressing pressure to the trapezoid oblique side sections. In consequence, it is difficult to secure the sealing performance at the upper portion of the trapezoid oblique side, which is problematic.

In the case of the "waterproof-type electronic apparatus" of Japanese Patent Application Publication No. 2012-069611, there is provided a fused portion of an annular sealing material and a streaked sealing material divisionally applied twice, to absorb thereby the surplus of sealing material that has been applied excessively in order to secure sealability.

In the case of the first assembly method, however, the cover is mounted in a state where the short top side section of the connector housing faces a ceiling surface; hence, a problem arises in that the sealing material is scraped downward on account of the ridge that is provided on the trapezoid oblique side sections, on the cover side, and the sealing material density at the upper portion is reduced, which results in excessive density at the lower portion.

In the case of the second assembly method, the connector housing is mounted in a state where the short top side section of the cover faces the floor; hence, a problem arises in that the sealing material is scraped downward on account of the ridge that is provided on the trapezoid oblique side sections, on the connector housing side, and the sealing material density at the upper portion is reduced, which results in excessive density at the lower portion.

Although some of the excessive sealing material can be expected to be absorbed at the widened fused portion, sealability at the thinned portion is however impaired, which is problematic.

(2) Explanation of the Objects of the Invention

It is a first object of the present invention to solve the above problems by providing a waterproof-type control unit wherein which reduction in the sealing material density is prevented, the mold construction of a cover or base that is worked through molding or sheet metal working is simplified, and a connector housing is prevented from taking on a long-bodied dimension.

It is a second object of the present invention to provide a method for assembling a waterproof-type control unit that enables easy application of a waterproof sealing material that replenishes a portion in which the density of the waterproof sealing material has been reduced.

Solution to Problem

The waterproof-type control unit of the present invention is provided with a casing made up of a base and a cover, and a circuit board hermetically accommodated in the casing to which one end of each of a plurality of contact terminals for external connection, which are pressed into a connector housing that is a resin molded member, and a plurality of circuit components, are soldered and connected, the waterproof-type control unit further including a waterproof sealing material is provided that fills a first sealing gap that is provided on opposing surfaces of the connector housing and the cover, a second sealing gap that is provided on opposing surfaces of the connector housing and the base, and a third sealing gap that is provided on opposing surfaces of the base and the cover, in order to expose an end face of the connector housing, through which the plurality of contact terminals penetrate, out of the casing, wherein the connector housing is provided with a partition wall in which the plurality of the contact terminals are held by press-fitting, the end face of the connector housing is of trapezoid shape; a long bottom side of the trapezoid is fixed to one side of the circuit board, a portion of the circuit board jutting out from one side opposes the base across the second sealing gap, and a short top side and left and right oblique sides of the trapezoid oppose an inner surface of a lateral opening of the cover across the first sealing gap; the cover is provided with a pair of first sealing concave surface sections, which constitute part of a cover-side gap surface of the first sealing gap, opposing a pair of trapezoid oblique side sections of the connector housing, and with a third sealing concave surface section, which constitutes a cover-side gap surface of the third sealing gap, opposing the base;

a second sealing concave surface section is provided on the long bottom side of the connector housing, which forms the second sealing gap, opposing the base, and the second sealing concave surface section and the third sealing concave surface section communicate with each other to form a concave surface section of an annular sealing gap;

the cover is further provided with overlap reservoirs into which part of the waterproof sealing material flows, and with replenishing inclined surface sections that are provided in trapezoid oblique side sections of the cover and that are parallel to the first sealing concave surface sections, at connection and merging position of the first sealing concave surface sections and the third sealing concave surface section; and the waterproof sealing material for the first sealing gap is applied turning around at a first sealing gap surface and the replenishing inclined surface sections of the cover, via the overlap reservoirs.

A method for assembling the above waterproof-type control unit, the method including:

a first process step of mounting a cover, in a flipped state, on a jig, and applying a paste-like waterproof sealing material, which is divided into a first sealing material and a second sealing material, onto a seal surface that makes up a first sealing gap of the cover, in a non-annular fashion;

a second process step of mounting a circuit board, on which circuit components and a connector housing are mounted beforehand and which has undergone mounting soldering, on an installation shelf stepped portion provided on three sides of the outer periphery of the cover, to join thereby the connector housing and the cover;

a third process step of applying a paste-like waterproof sealing material, in a ring-like fashion, onto seal surfaces that make up a third sealing gap of the cover and a second sealing gap of the connector housing, which have completely undergone the second process step; and a fourth process step of mounting a base on the cover having completely undergone the third process step, integrally fixing the cover and the base, and clamping and fixing the circuit board with three outer peripheral sides of the cover and the base, wherein the first and second sealing materials are applied turning around in a U-shape, with an intermediate portion of a trapezoid short top side section in a lateral opening of the cover as a start point or end point, and with replenishing inclined surface sections that are parallel to first sealing concave surface sections provided in a pair of trapezoid oblique side sections, as an end point or start point; and after the fourth process step is over, the paste-like waterproof sealing material is dried and cured by being left to stand at normal temperature or through heating, while performing visual inspection and performance inspection.

Advantageous Effects of Invention

As described above, in the waterproof-type control unit of the present invention, a casing in which a circuit board is hermetically accommodated is made up of a base, a cover and a connector housing; in the casing, a waterproof sealing material is applied so as to fill a first sealing gap made up of opposing surfaces of a lateral opening of the cover and a short top side and a pair of oblique sides of the trapezoidal connector housing, a second sealing gap made up of opposing surfaces of a long bottom side of the connector housing and the base, and a third sealing gap made up of opposing surfaces of the cover and the base; in this waterproof sealing material, the waterproof sealing material that is applied to the first sealing gap surface is applied turning around also at replenishing inclined surface sections that are provided on trapezoid oblique side sections of the cover, via overlap reservoirs that are provided at a boundary position between the first sealing gap surface and a third sealing gap surface. Therefore, the waterproof sealing material is applied firstly to the first sealing gap surface of the cover. Thereafter, upon mounting of the circuit board and the connector housing, the waterproof sealing material applied to the upper portion of the trapezoid oblique side sections is pushed downward by the connector housing; thereby the filling density decreases, and the waterproof sealing material applied to the replenishing inclined surface sections is compensated at the trapezoid oblique side sections at which fastening pressure on the sealing gap is not readily exerted. An effect can be elicited as a result of enhancing the waterproof sealing performance of the trapezoid inclined surface section. Part of the waterproof sealing material that is applied in a ring-like fashion to the first sealing gap or the third sealing gap and the second sealing gap flows into the overlap reservoir; an effect is elicited thereby of allowing the waterproof sealing material to fill uniformly the connection and merging position of the third sealing gap and the second sealing gap.

The method for assembling a waterproof-type control unit of the present invention, as described above, involves applying the waterproof sealing material onto a seal surface that makes up the first sealing gap of the cover, mounting thereafter the circuit board having the connector housing; applying next, in a ring-like fashion, the waterproof sealing material onto a seal surface that makes up the third sealing gap of the cover and the second sealing gap of the connector housing;

thereafter, connecting the foregoing two, integrally fixing the whole, and performing thereafter visual inspection and performance inspection, wherein the waterproof sealing material that fills the first sealing gap is applied, which is divided into a first sealing material and a second sealing material, in a non-annular fashion.

Therefore, both the first and second sealing materials are applied to the inner surface of the lateral opening of the cover, via a route that extends from the short top side section, up along the inclined surface section, and turning to form a U-shape to reach the replenishing inclined surface sections at a high stepped portion, or along the inverse route of the foregoing. An effect is elicited thereby of making it possible to apply the sealing material uniformly as compared with an instance of a single-path scheme that leads from one replenishing inclined surface section as the start, followed by turning to form a U-shape, down an inclined surface, moving onto a flat surface section, and up an inclined surface section, followed by turning to form a U-shape, to reach the other replenishing inclined surface section.

The waterproof sealing material is applied firstly to the first sealing gap surface of the cover. Thereafter, upon mounting of the circuit board and the connector housing, the waterproof sealing material applied to the upper portion of the trapezoid oblique side sections is pushed downward by the connector housing; thereby an effect can be elicited of making it possible to compensate the reduction of the filling density by the waterproof sealing material having been applied to the replenishing inclined surface sections, while preventing the filling density at the lower portion from becoming excessive, through adjustment of the position of a tapering overlap portion of the first and second sealing materials.

DESCRIPTION OF EMBODIMENTS

Embodiment 1

(1) Detailed Explanation of the Configuration

The configuration of a waterproof-type control unit according to Embodiment 1 of the present invention will be explained next with reference to FIG. 1 being an external-view diagram of the waterproof-type control unit, FIG. 2 being a side-view cross-sectional diagram of the waterproof-type control unit of FIG. 1 along line Z2-Z2, to FIG. 3 being an internal-view diagram showing independently a cover of the waterproof-type control unit of FIG. 1, to FIG. 4 being a side-view cross-sectional diagram of FIG. 3, to FIG. 5 being an internal-view diagram showing independently a base of the waterproof-type control unit of FIG. 1, and to FIG. 6 being a cross-sectional diagram of the waterproof-type control unit of FIG. 1 along line Z6-Z6, in this order.

Figure 1:
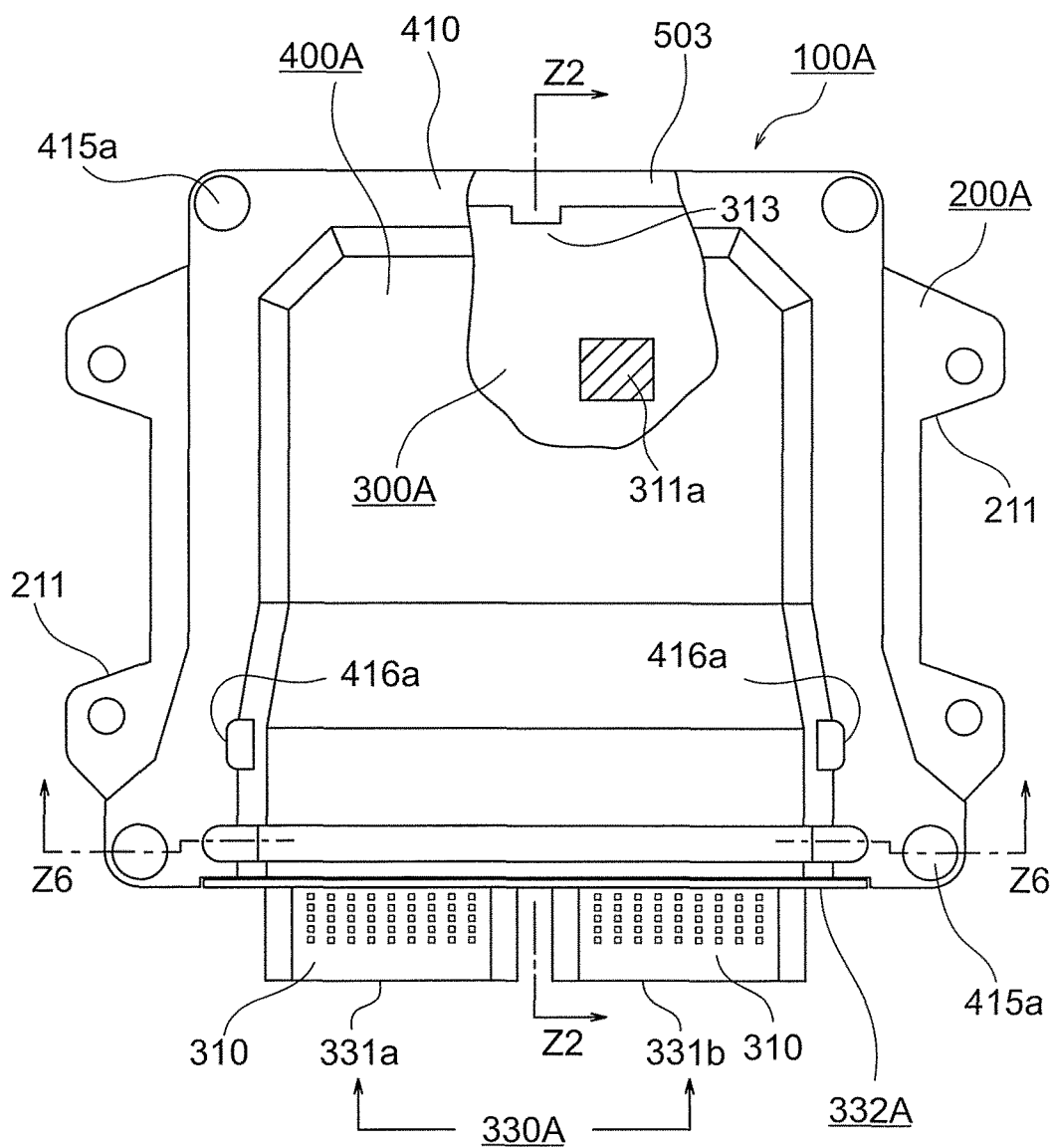
FIG. 1 is an external-view diagram of a waterproof-type control unit according to Embodiment 1 of the present invention.
Figure 2:
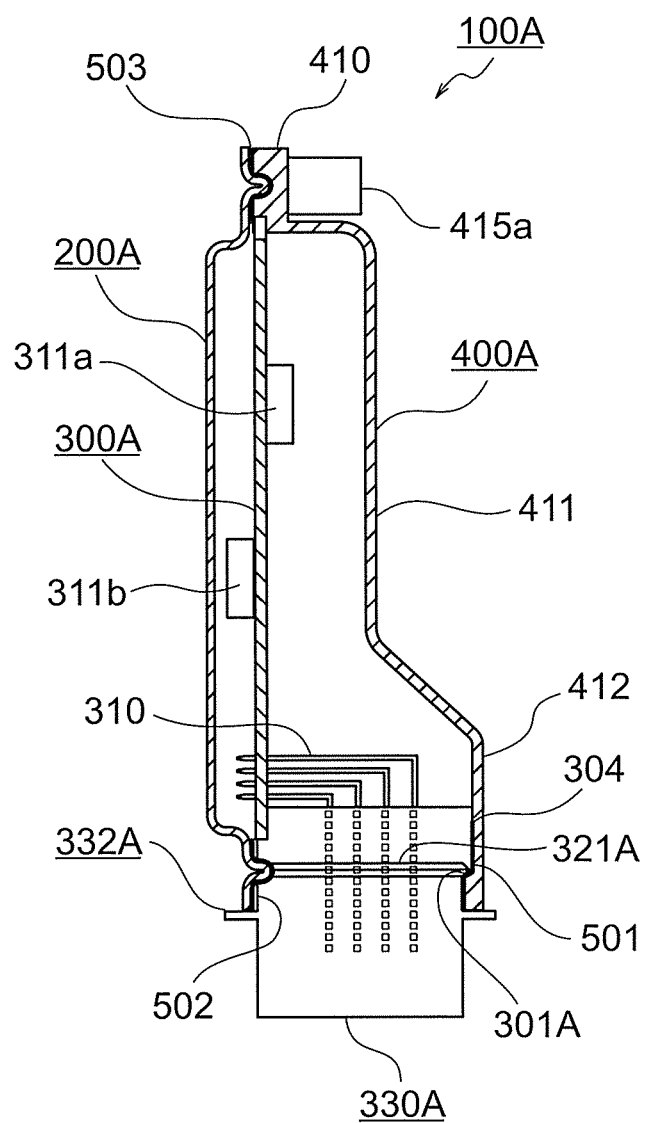
FIG. 2 is a side-view cross-sectional diagram of the waterproof-type control unit of FIG. 1 along line Z2-Z2.

In FIG. 1 and FIG. 2, a waterproof-type control unit 100A is configured of a base 200A, made of sheet metal and having mounting feet 211 on four sides; a circuit board 300A having mounted thereon a plurality of circuit components 311a, 311b; and a cover 400A made of sheet metal. The cover 400A has an edge-like flange 410 provided on three sides of an outer peripheral wall portion; a low-step portion 411 that constitutes a shallow bottom face; and a rear-step portion 412 that constitutes a deep bottom face. The outer peripheral wall portion on the remaining side is missing, and constitutes a lateral opening 413 (see FIG. 3) that is blocked by a connector housing 330A.

A connector housing 330A into which first and second connector housings 331a, 331b are integrally formed is attached to one side of the circuit board 300A. An annular peripheral wall 332A is projectingly provided on the outer periphery of the first and second connector housings 331a, 331b.

A plurality of contact terminals 310 of a right-angle type are held through press-fitting on a partition wall 333 (FIG. 6) of the connector housing 330A, one end of each of the plurality of contact terminals 310 being soldered to the circuit board 300A.

Onto the circuit board 300A there are soldered an inner surface circuit component 311a mounted on the inner surface side, opposing the cover 400A, and an outer surface circuit component 311b mounted on the outer surface side, opposing the base 200A side. A third sealing convex surface section 203A (FIG. 5) that constitutes a third sealing gap between the base 200A and the cover 400A, and a second sealing convex surface section 202A (FIG. 5) that constitutes a second sealing gap between the base 200A and a long bottom side of the connector housing 330A, are formed communicating with each other, in an endless annular fashion, on the outer periphery of the base 200A. Herein there are formed a third sealing concave surface section 403A (FIG. 3) that constitutes a third sealing gap between the cover 400A and the base 200A, on three sides of the outer periphery of the cover 400A, a first sealing cover top side section 401A (FIG. 3) that constitutes a first sealing gap between the cover 400A and three sides of a trapezoid of a connector housing 330A, and first sealing concave surface sections 431A (FIG. 3) at left and right trapezoid oblique side sections.

In the connector housing 330A there are provided: first sealing convex surface sections 321A (FIG. 2), provided in trapezoid oblique side sections and that oppose the first sealing concave surface sections 431A of the cover 400A, a first sealing top side section 301A (FIG. 2) provided in a short top side section and that opposes the first sealing cover top side section 401A of the cover 400A, and a second sealing concave surface section 322A (FIG. 10) that opposes the second sealing convex surface section 202A of the base 200A.

Figure 3:
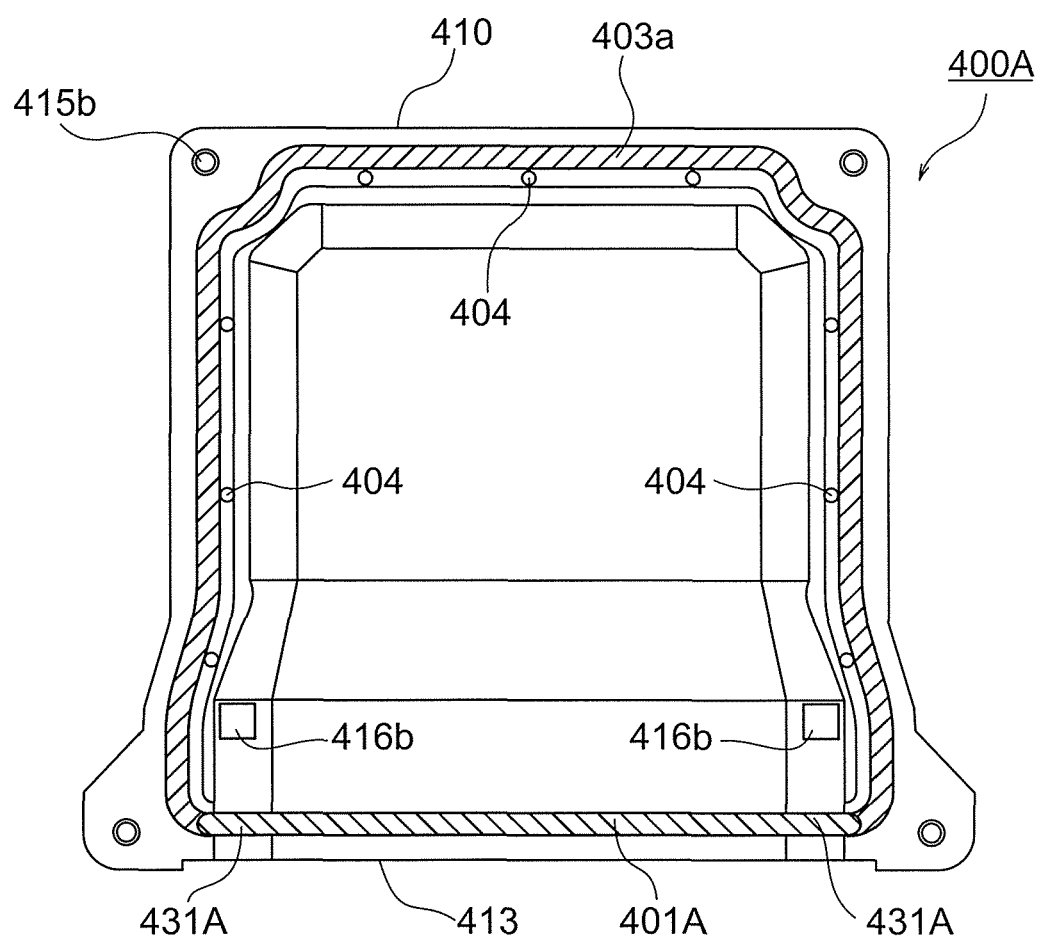
FIG. 3 is an internal-view diagram showing independently a cover of the waterproof-type control unit of FIG. 1.
Figure 5:
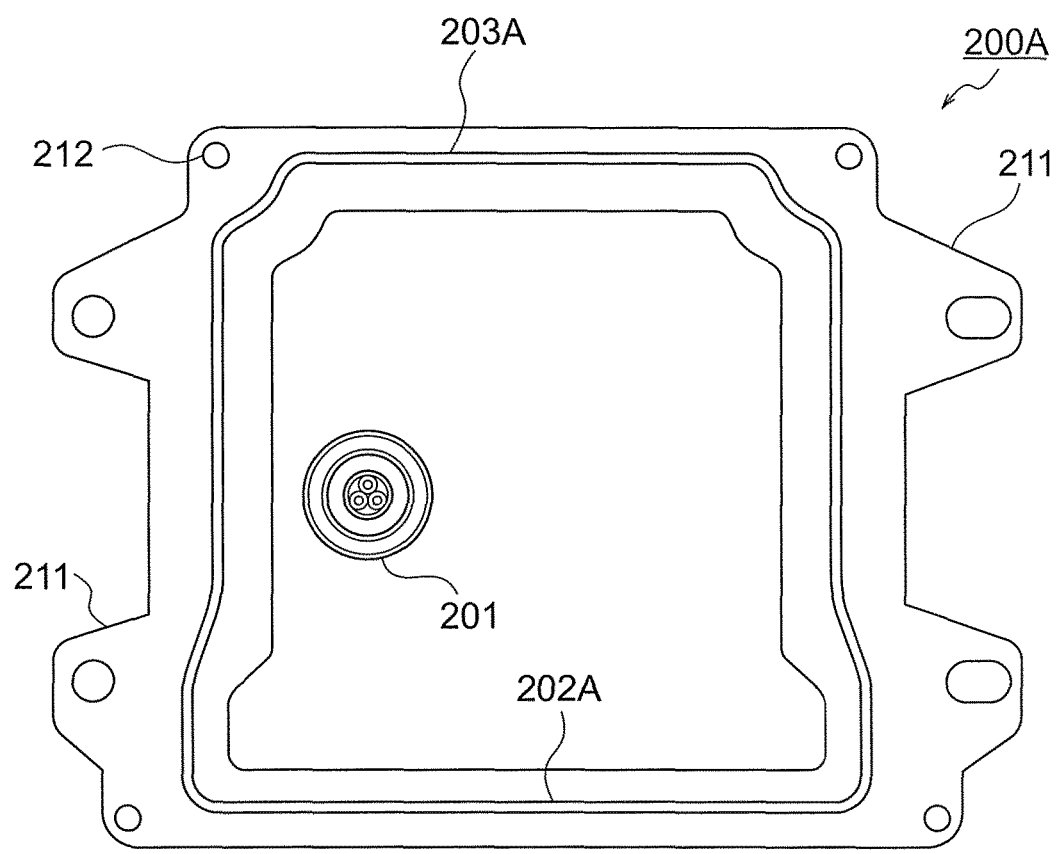
FIG. 5 is an internal-view diagram showing independently a base of the waterproof-type control unit of FIG. 1.
Figure 6:
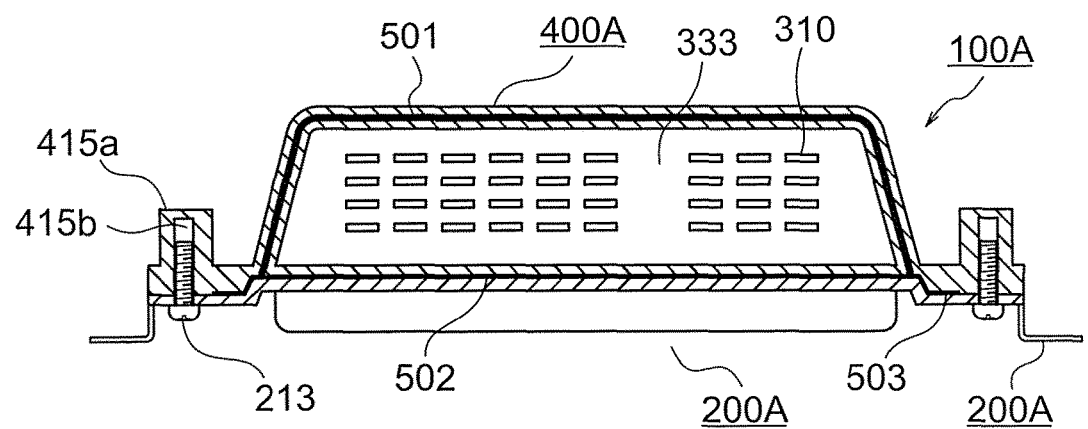
FIG. 6 is a cross-sectional diagram of the waterproof-type control unit of FIG. 1 along line Z6-Z6.

Screw holes 415b illustrated in FIG. 3 and FIG. 6 are provided on the inner surfaces of the screw hole protruding portions 415a that are provided at the four corners of the cover 400A in FIG. 1. The base fixing screws 213 of FIG. 6 run through base fixing holes 212 of FIG. 5, to fasten and fix the base 200A and the cover 400A to each other. As illustrated in FIG. 1 and FIG. 2, a waterproof sealing material 501 is applied at the first sealing gap formed by the cover 400A and the connector housing 330A, a waterproof sealing material 502 is applied at the second sealing gap formed by the base 200A and the connector housing 330A, and a waterproof sealing material 503 is applied at the third sealing gap formed by the base 200A and the cover 400A.

A board cutout 313 illustrated in FIG. 1 is provided in the circuit board 300A that is clamped on three sides of the outer periphery of the base 200A and the of the cover 400A. The board cutout 313 is utilized when the waterproof-type control unit 100A is pry-opened, with the edge of a screwdriver being inserted thereto, when the waterproof-type control unit 100A is disassembled and the circuit board 300A is removed therefrom. The board cutout 313 is provided at a position adjacent to the position of a beginning 503a and a terminal 503b (FIG. 10) of the waterproof sealing material 503 that is applied, in a ring-like fashion, at the second sealing gap and the third sealing gap.

Fitting holes 416b of FIG. 3 are illustrated in the inner surface of fitting projections 416a in FIG. 1. Positioning protrusions, not shown, that are provided in the connector housing 330A are fitted into the fitting holes 416b, for the purpose of regulating the assembly relative position of the cover 400A and the connector housing 330A.

Figure 4:
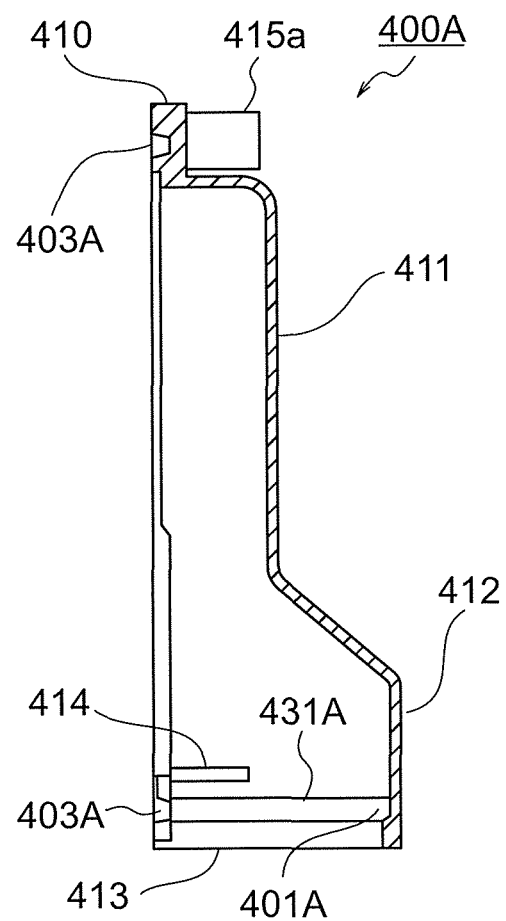
FIG. 4 is a side-view cross-sectional diagram of FIG. 3.
Figure 20:
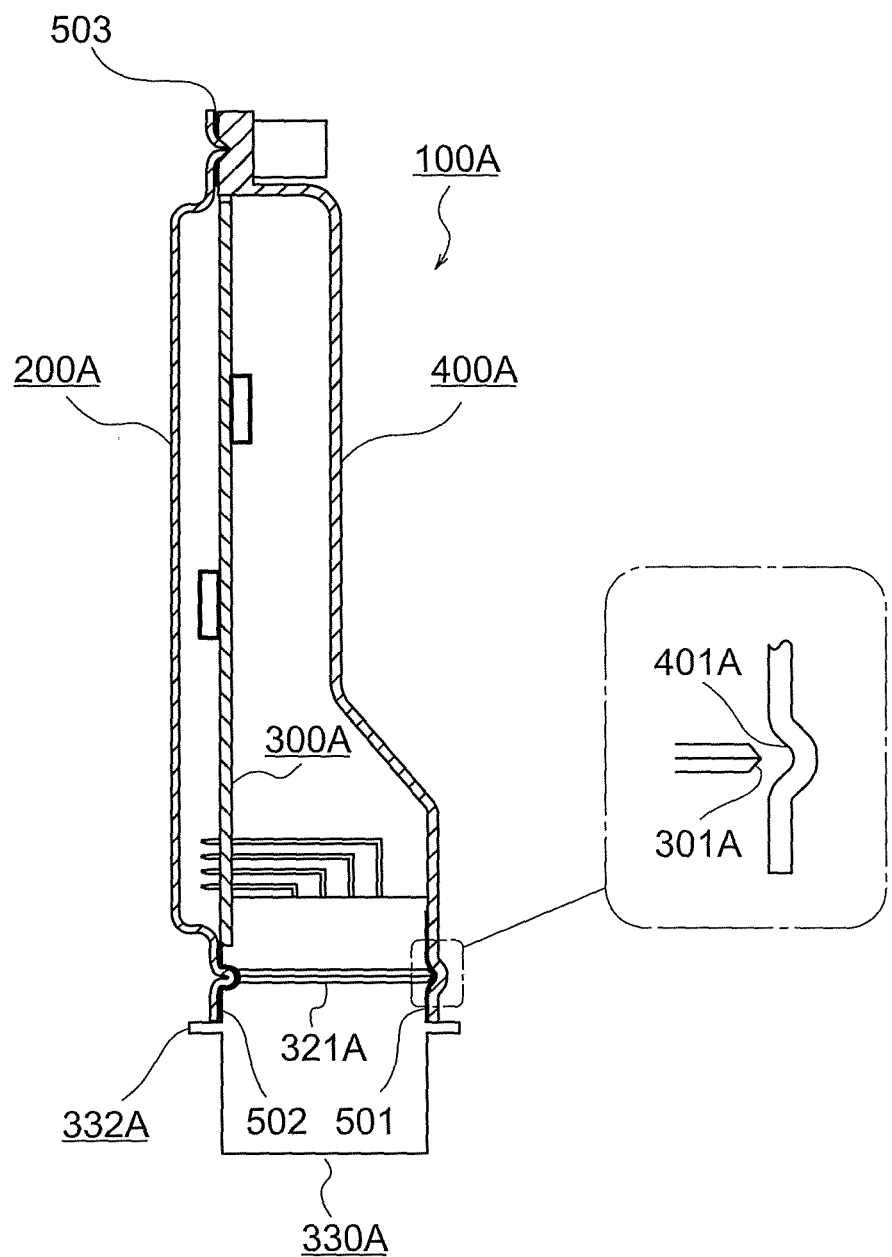
FIG. 20 is a cross-sectional diagram of a waterproof-type control unit according to a first variation of the present invention.

In FIG. 3 and FIG. 4 the above-described third sealing concave surface section 403A, which is provided on three sides of the outer periphery of the cover 400A, forms the third sealing gap opposing the third sealing convex surface section 203A (FIG. 5) that is provided in the base 200A, and, on the inner surface of the lateral opening 413 of the cover 400A, is connected to the first sealing concave surface sections 431A provided in the trapezoid oblique side sections, the third sealing concave surface section 403A being mutually connected via the first sealing cover top side section 401A that sinks toward the rear side of the printed sheet showing FIG. 3. The first sealing top side section 301A in FIG. 2 is a terrace-like inclined surface structure similar to a below-described first sealing top side section 301B in FIG. 15A, or is an extension of the first sealing convex surface sections 321A in trapezoid oblique side sections without any modification, as illustrated in the variation of FIG. 20. The first sealing concave surface sections 431A and the first sealing cover top side section 401A illustrated in FIG. 4 oppose the first sealing convex surface sections 321A and the first sealing top side section 301A of FIG. 2.

Therefore, the first sealing cover top side section 401A in FIG. 4 is a terrace-like inclined surface structure similar to a below-described first sealing cover top side section 401B in FIG. 15A,
or is an unmodified extension of the first sealing concave surface sections 431A in trapezoid oblique side sections, illustrated in the variation of FIG. 20.

In FIG. 3, a plurality of third protrusions 404 are provided on three sides of the outer periphery of the cover 400A, respectively. These gap-setting protrusions abut three sides of the outer periphery of the base 200A, to define thereby a gap dimension of the third sealing gap, and press and clamp three sides of the circuit board 300A.

The spacing between the third protrusions 404 and the mounting surface of the base 200A having the circuit board 300A disposed thereon is larger than the thickness dimension of the circuit board 300A. Thus, base fixing screws 213 (FIG. 6) of the base 200A and the cover 400A can be tightened while preventing screw loosening, even upon curving deformation of the circuit board 300A; herein, the waterproof sealing material 503 that fills the third sealing gap flows into the curvedly deformed portion of the circuit board 300A, and hence the occurrence of wobbling is prevented by the filling waterproof sealing material 503 even upon gradual straightening and flattening of the curving deformation of the circuit board 300A in the stage of practical use.

The gap-regulating walls 414 of FIG. 4 are provided on trapezoid oblique side sections 413a (FIG. 8) of the inner surface of the lateral opening 413 of the cover 400A; thereby, the assembled gap dimension of the first sealing gap is regulated by virtue of the fact that the gap-regulating walls 414 oppose, from a close distance, the trapezoid oblique side sections of the connector housing 330A.

In FIG. 5, a waterproof filter 201 having porous vent holes and being impervious to water is bonded and fixed to the inner bottom face of the base 200A; however, the waterproof filter 201 may alternatively be attached to the inner surface of the cover 400A or the connector housing 330A.

In FIG. 6, the cover 400A and the base 200A are integrally fastened by way of the above-described base fixing screws 213, but elastic hooks or bend-crimping members may be alternatively used instead of the fixing screws 213.

Such a fastening method is convenient, but pressing of the waterproof seal surface against the trapezoid oblique side sections of the cover 400A and the connector housing 330A involves a difficult structure, and accordingly, some contrivance is required in order to prevent the waterproof sealing performance at the trapezoid oblique side sections from becoming worse than the waterproof sealing performance at the second sealing gap or the third sealing gap.

In FIG. 2, first protrusions 304 are provided in either one of the opposing surfaces of a trapezoid top side section of the connector housing 330A and the cover 400A. The first protrusions 304 constitute herein gap-setting protrusions for the first sealing gap.

Similarly, the third protrusions 404 of FIG. 3 are provided in either one of the opposing surfaces at the three outer peripheral sides of the base 200A and the cover 400A, such that the third protrusions 404 constitute gap-setting protrusions for the first sealing gap.

Second protrusions, not shown, that regulate the second sealing gap can be provided between the base 200A and the long bottom face of the connector housing 330A. However, the second sealing gap can be regulated on the basis of the height of the attachment surface of the circuit board 300A and the base 200A. Gap setting protrusions for the second sealing gap can be omitted in that case.

Figure 7:
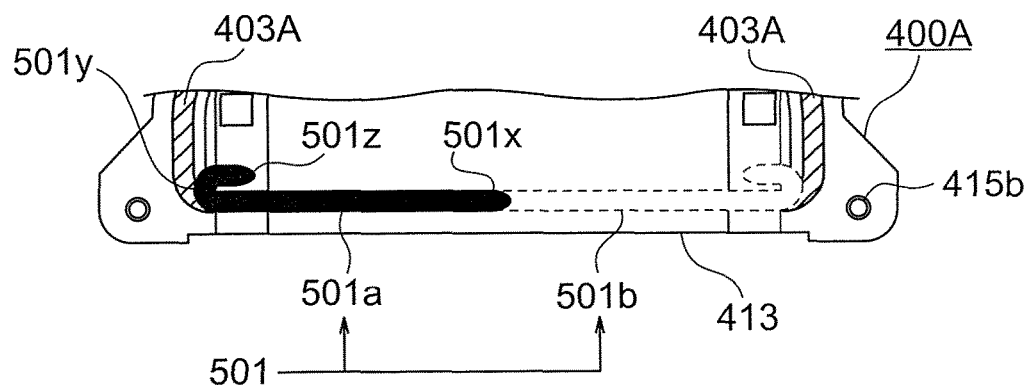
FIG. 7 is a partial enlarged-view diagram of FIG. 3.

The detailed configuration of the waterproof-type control unit according to Embodiment 1 will be explained next with reference to FIG. 7 being a partial enlarged-view diagram of FIG. 3, to FIG. 8 being a partial enlarged-view diagram of FIG. 7, to FIG. 9 being an enlarged-view diagram after application of a sealing material in FIG. 8, to FIG. 10 being an internal-view diagram of a state in which a circuit board has been disposed in the cover of FIG. 3, and to FIG. 11 being a partial enlarged-view diagram of FIG. 10, in this order. In FIG. 7, the first sealing gap that opposes three sides of the trapezoid of the connector housing 330A is configured on the inner surface of the lateral opening 413 of the cover 400A; accordingly, the waterproof sealing material 501 that is applied to the first sealing gap surface is divided into a first sealing material 501a and a second sealing material 501b.

The first and second sealing materials 501a, 501b are applied, in the left-right direction, with a tapering overlap portion 501x at an intermediate position of the short top side section as a start point (or end point) and are sequentially applied divisionally up along trapezoid oblique side sections, followed by a turn-back at a U-shaped turn-back portion 501y, and down once more along the trapezoid inclined surface section, up to a replenishment end section 501z as an end point (or start point).

Figure 8:
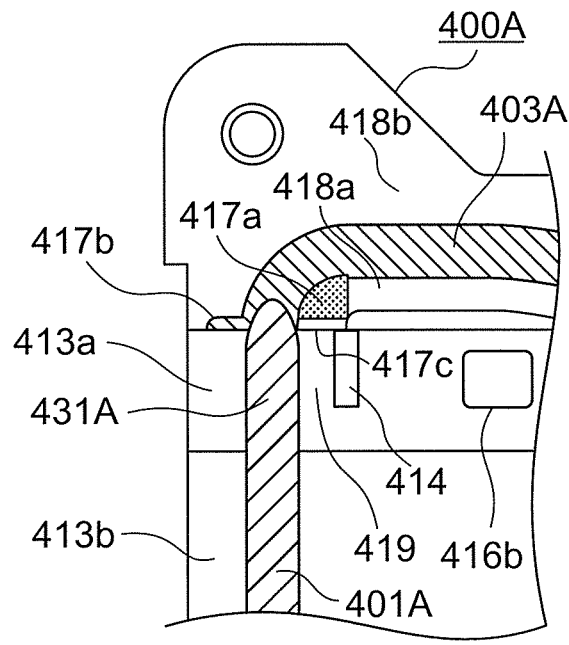
FIG. 8 is a partial enlarged-view diagram of FIG. 7.

In FIG. 8, the third sealing concave surface section 403A provided in the cover 400A describes a trough surface that is carved in the depth direction of the paper, from the surface of an inner flat surface section 418a and an outer flat surface section 418b, being flush surface sections.

An overlap reservoir 417a is a shelf passage that is carved, in the surface of the inner flat surface section 418a, down to an intermediate depth of a trough surface portion of the third sealing concave surface section 403A.

An overlap reservoir 417b is an outer deep portion that is carved, in the surface of the outer flat surface section 418b, to a depth identical to that of the trough surface portion of the third sealing concave surface section 403A.

An overlap reservoir 417c is an inner deep portion that is carved, in the surface of part of the overlap reservoir 417a, to a depth identical to that of the trough surface portion of the third sealing concave surface section 403A.

Similarly, the first sealing concave surface sections 431A and the first sealing cover top side section 401A are carved in the trapezoid oblique side sections 413a and the short top side section 413b at the inner surface of the lateral opening 413 of the cover 400A; herein, the first sealing concave surface sections 431A connect and merge with the third sealing concave surface section 403A at a trough surface of the latter.

In this connection and merging position, the center lines of the first sealing concave surface sections 431A are provided further inward than the center line of the third sealing concave surface section 403A to be mutually connected; thereby, the first sealing concave surface sections 431A can be formed inside the third sealing concave surface section 403A, even if the third sealing concave surface section 403A has a smooth arcuate shape.

The gap-regulating walls 414 described above in FIG. 4 and the fitting holes 416b described above in FIG. 3 are provided on the inner side of the trapezoid oblique side section 413a. Positioning protrusions, not shown, that are provided in the trapezoid oblique side sections of the connector housing 330A become fitted into the fitting holes 416b; thereby, relative positioning during assembly is regulated, and the gap-regulating walls 414 oppose from a close distance the trapezoid oblique side sections of the connector housing 330A. Replenishing inclined surface sections 419 between the gap-regulating walls 414 and the first sealing concave surface sections 431A make up part of the trapezoid oblique side sections 413a. The replenishment end section 501z of the first sealing material 501a is applied to each replenishing inclined surface section 419.

Figure 9:
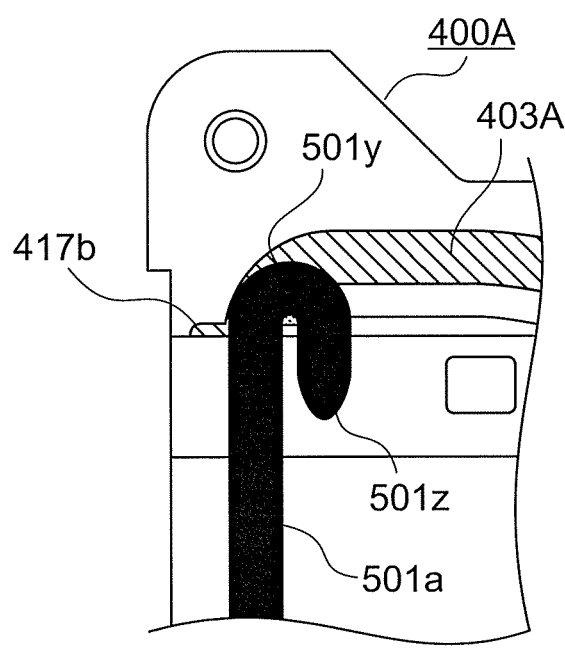
FIG. 9 is an enlarged-view diagram after application of a sealing material in FIG. 8.

In FIG. 9, the first sealing material 501a is applied turning around in the form of a U-shape, with a start point (or end point) at an intermediate portion of the trapezoid short top side section 413b at the lateral opening 413 of the cover 400A, and with the end point (or start point) at the replenishing inclined surface sections 419 that run parallel to the first sealing concave surface sections 431A provided in the trapezoid oblique side sections 413a. The same is true of the other second sealing material 501b.

The waterproof sealing material 501 is applied firstly to the first sealing gap surface of the cover 400A. Thereafter, upon mounting of the circuit board 300A and the connector housing 330A, the waterproof sealing material 501 is compressed and deformed by the convex surface section on the connector housing 330A side; thereby the waterproof sealing material 501 diffuses towards the outer periphery of the concave surface section, and a waterproof seal surface of a predetermined width becomes formed as a result.

However, the waterproof sealing material 501 that is applied to the upper portion of the trapezoid oblique side sections is pushed down by the connector housing 330A, and the filling density of the waterproof sealing material 501 is reduced thereby, so that a waterproof seal surface of predetermined width cannot be formed. This problem is solved through compensation by the waterproof sealing material that is applied to the replenishing inclined surface sections 419. Upon attachment of the base 200A at the position at which the outer flat surface section 418b of the cover 400A and the long bottom side of the connector housing 330A connect and merge, the U-shaped turn-back portion 501y of the waterproof sealing material 501 is caused to flow, through pressure contact, into the overlap reservoir 417b, so that the thinned out waterproof sealing material is compensated as a result.

The same is true of the inner deep portion by the overlap reservoir 417c.

Figure 10:
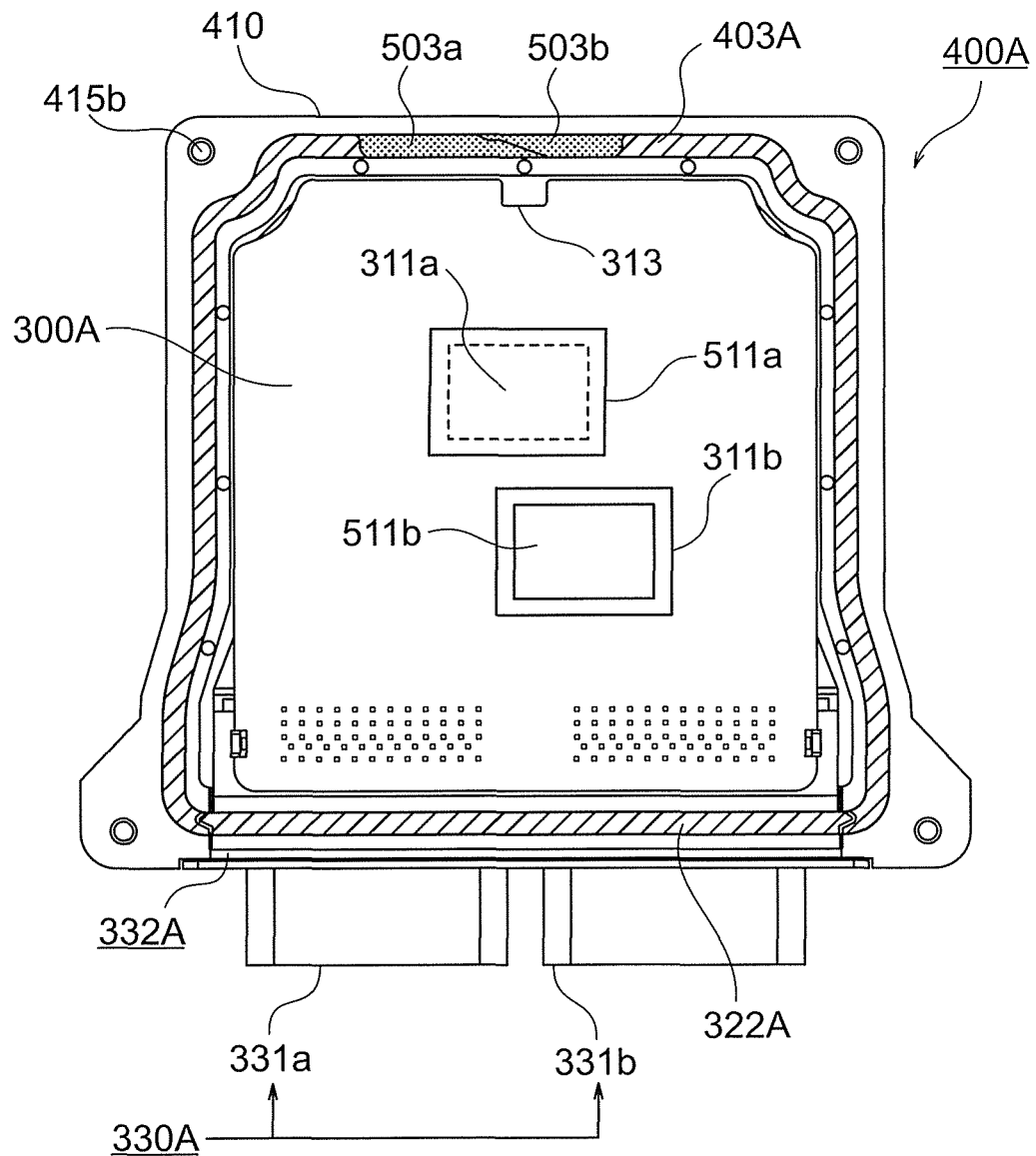
FIG. 10 is an internal-view diagram of a state in which a circuit board has been disposed in the cover of FIG. 3.

In FIG. 10, the waterproof sealing material 501 described above in FIG. 7 is applied to the lateral opening 413 of the cover 400A; thereafter, there is disposed the circuit board 300A having the connector housing 330A mounted thereon, the waterproof sealing material 503, 502 is applied, in annular fashion, on the third sealing concave surface section 403A of the cover 400A and on the second sealing concave surface section 322A of the connector housing 330A. The beginning 503a and the terminal 503b become thus positioned adjacent to the board cutout 313 of the circuit board 300A.

Figure 14:
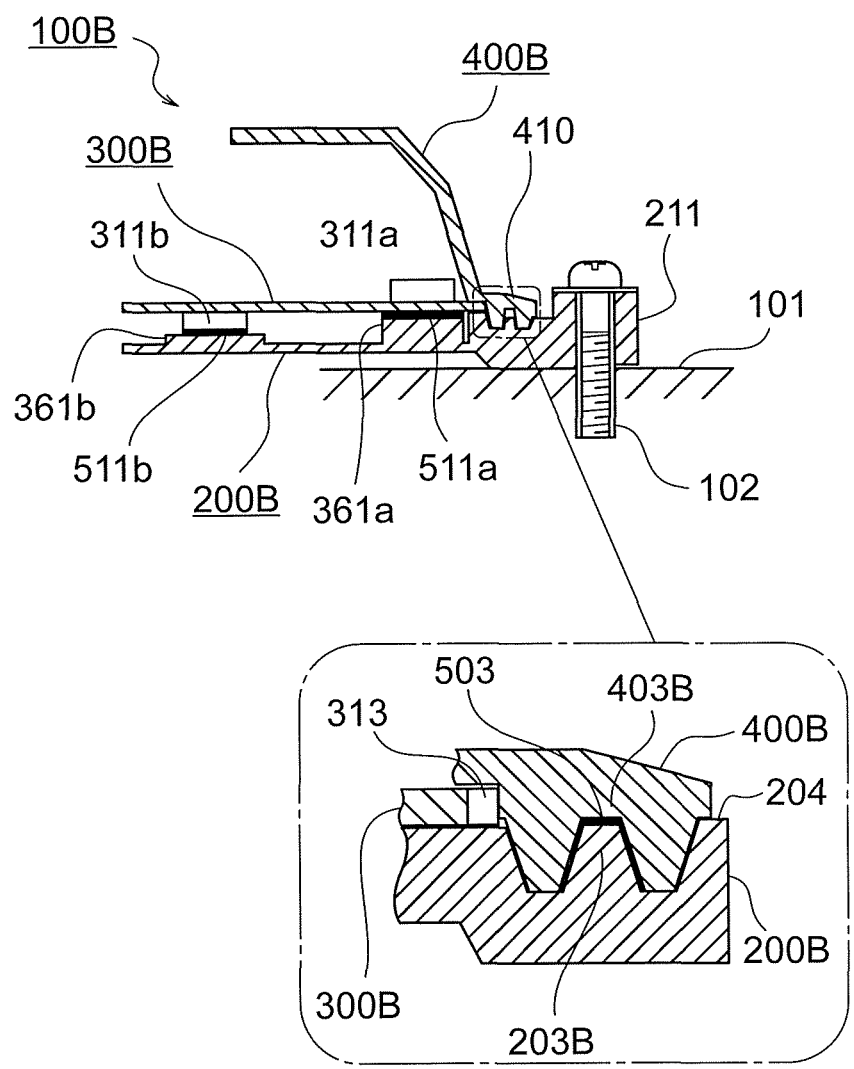
FIG. 14 is an attachment cross-sectional diagram of the waterproof-type control unit of FIG. 13.

A heat-transfer adhesive 511a is applied to the board surface on the base 200A side constituting the rear face section of the inner circuit component 311a that is provided on the circuit board 300A, on the surface opposing the cover 400A, and a heat-transfer adhesive 511b is applied to the surface of the outer circuit component 311b provided on the circuit board 300A, on the surface opposing the base 200A; thereby, the circuit components become bonded to first and second heat-transfer seats 361a, 361b illustrated in FIG. 14 upon attachment of the base 200A.

Figure 11:
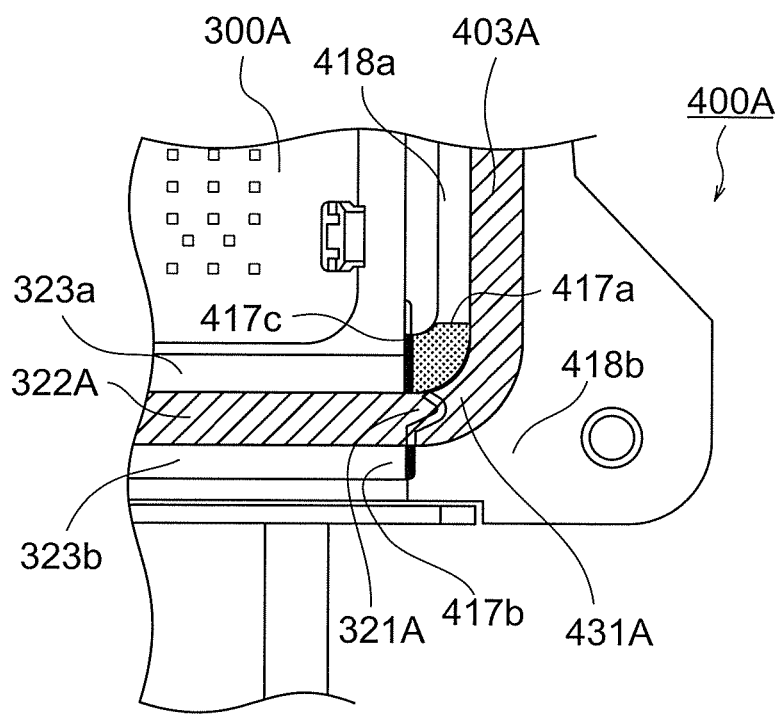
FIG. 11 is a partial enlarged-view diagram of FIG. 10.

In FIG. 11, with the second sealing concave surface section 322A of the connector housing 330A being carved into the surface of the second sealing convex surface sections 323a, 323b, the second sealing concave surface section 322A is flush with and flanked by the second sealing convex surface sections 323a, 323b, hence is flush with the flat surface sections 418a, 418b having formed thereon the third sealing concave surface section 403A of the cover 400A.

The trough surface of the second sealing concave surface section 322A and the trough surface of the third sealing concave surface section 403A constitute trough surfaces of identical depth.

Therefore, the first and second sealing materials 501a, 501b are applied, as illustrated in FIG. 7, on the first sealing gap surface of the cover 400A, and thereafter, the circuit board 300A and the connector housing 330A are disposed as illustrated in FIG. 10, whereupon the shortfall of the waterproof sealing material 501 in the trapezoid oblique side sections is made up for by the replenishing end section 501z of FIG. 9. Next, upon integration by disposing the base 200A after application of the waterproof sealing material 503, 502, the sealing material at the joint portion of the waterproof sealing material 503, 502, mainly at the U-shaped turn-back portion 501y of the first and second sealing materials 501a, 501b, is pressed and caused to fill the inner and outer overlap reservoirs 417c, 417b and the sealing gap between the first sealing convex surface sections 321A of the connector housing 330A and the first sealing concave surface sections 431A of the cover 400A. The shortage of waterproof sealing material in the first sealing gap is compensated as a result.

(2) Detailed Explanation on an Assembly Method

Figure 12:
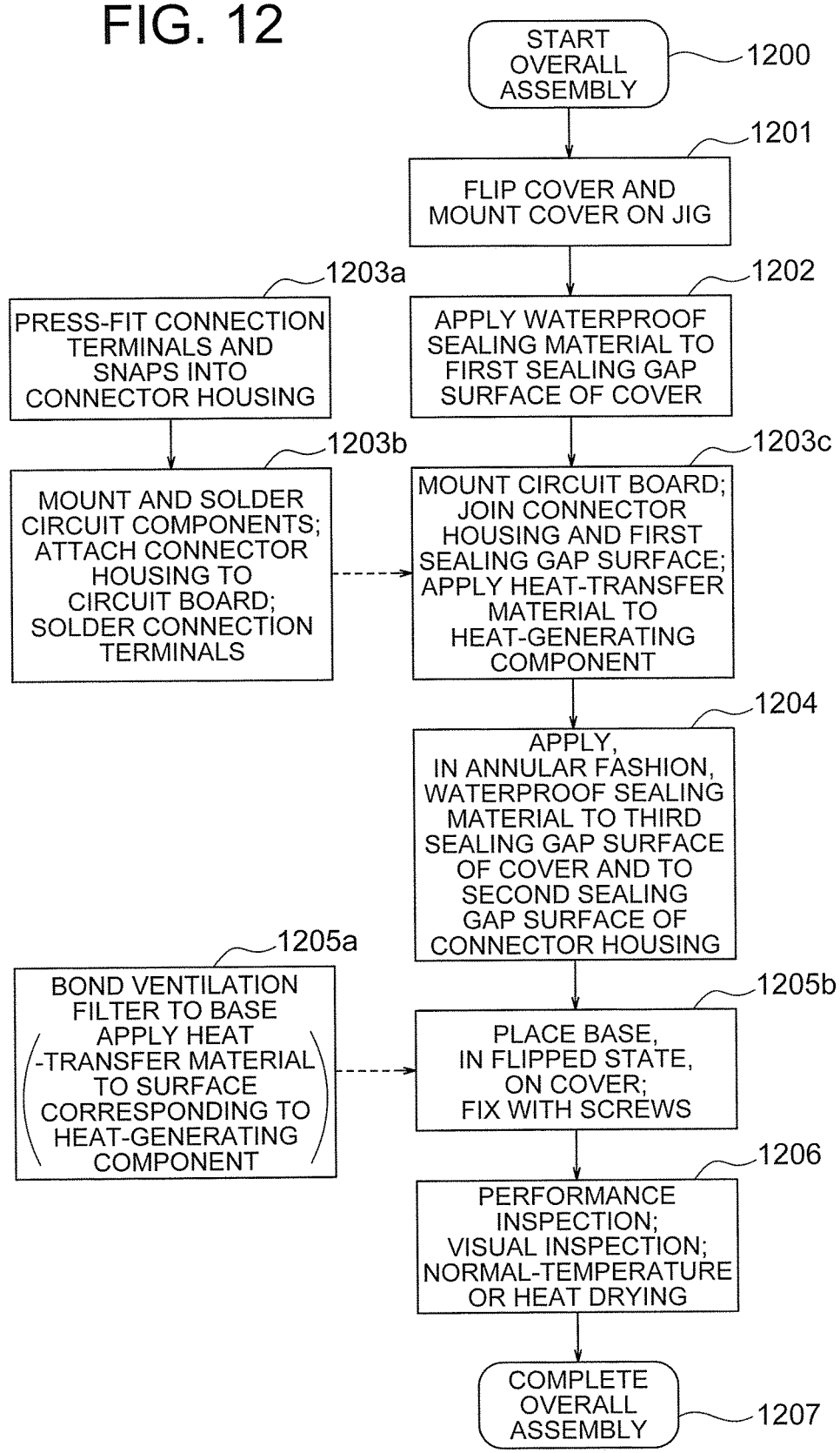
FIG. 12 is an assembly process chart of a waterproof-type control unit according to the present invention.

The method for assembling a waterproof-type control unit of the present invention will be explained next in detail on the basis of FIG. 12, which is an assembly process chart. Although in FIG. 12 step 1200 is the starting step of the assembly operation of the waterproof-type control unit 100A, there are preparation steps 1203a, 1203b and 1205a to be implemented before starting step 1200 is implemented. Preparation step 1203a is a step of press-fitting multiple contact terminals 310 into the partition wall 333 of the connector housing 330A, and pressing positioning protruding pieces 351 (related drawing, see FIG. 15A), being for instance snaps, onto the connector housing 330A, whereby the positioning protruding pieces 351 become fitted into and fixed to board holes 350 of the circuit board 300A.

Preparation step 1203b is a step of mounting the multiple circuit components 311a, 311b to the circuit board 300A, soldering the components, and soldering one end of each of the of the contact terminals 310 to respective lands provided on the circuit board 300A, to finish up an "intermediate assembly of a circuit board".

Preparation step 1205a is a step of bonding and fixing in use of an adhesive a ventilation filter, not shown, to the inner bottom face of the base 200A.

Step 1201 that follows starting step 1200 is a step of flipping the cover 400A and mounting the latter on an assembly jig.

Subsequent step 1202 is a first process step of applying the waterproof sealing material 501 to the first sealing gap surface of the cover 400A. As described above in FIG. 7, the waterproof sealing material 501 is applied divided into the first and second sealing materials 501a, 501b.

Subsequent step 1203c is a second process step of mounting the "intermediate assembly of a circuit board" finished in preparation step 1203b onto the inner surface of the cover 400A, and joining the waterproof sealing material 501, having been applied in step 1202, to a counterpart surface.

An additional process step during the second process step involves applying the thermally conductive adhesive 511a, 511b onto the surface of the outer circuit component 311b and onto the back surface of the circuit board 300A, at the mounting positions of the inner circuit component 311a.

Subsequent step 1204 is a third process step of applying the paste-like waterproof sealing material 502, 503, along a ring-like route, onto the third sealing gap surface of the cover 400A and the second sealing gap surface of the connector housing 330A. As illustrated in FIG. 10, the beginning 503a and the terminal 503b of the annular sealing material are adjacent to the board cutout 313 of the circuit board 300A.

Subsequent step 1205b is a fourth process step of: mounting the base 200A on the cover 400A, with the flipping the base 200A, to which the ventilation filter has been bonded and fixed in preparation step 1205a, being flipped over; and joining the thermally conductive adhesive 511a, 511b and waterproof sealing material 502, 503, having been applied in step 1203c and step 1204, to a respective counterpart surfaces, and integrally fixing the cover 400A and the base 200A by way of crimping members or screws.

Subsequent step 1206 is a step of carrying out initial setting and performance inspection or visual inspection of the waterproof-type control unit 100A, while drying, at normal temperature or through heating, the waterproof sealing material 501, 502, 503 and the thermally conductive adhesive 511a, 511b, having been applied in step 1203c and step 1204. The flow proceeds as a result to an overall assembly completion step 1207.

The application of the thermally conductive adhesive 511a, 511b, carried out as a process additional to step 1203c, may involve application of the thermally conductive adhesive 511a, 511b to the first and second heat-transfer seats 361a, 361b of the base 200A, in preparation process step 1205a.

(3) Gist and Features of Embodiment 1

As made apparent in the above explanation, the waterproof-type control unit according to Embodiment 1 of the present invention is a waterproof-type control unit 100A provided with: a casing made up of a base 200A and a cover 400A, and a circuit board 300A hermetically accommodated in the casing to which one end of each of a plurality of contact terminals 310 for external connection, which are pressed into a connector housing 330A that is a resin molded member, and a plurality of circuit components 311a, 311b, are soldered and connected; and a waterproof sealing material 501, 502, 503 is provided that fills a first sealing gap that is provided on opposing surfaces of the connector housing 330A and the cover 400A, a second sealing gap that is provided on opposing surfaces of the connector housing 330A and the base 200A, and a third sealing gap that is provided on opposing surfaces of the base 200A and the cover 400A, in order to expose an end face of the connector housing 330A, through the plurality of contact terminals 310 penetrate, out of the casing.

The connector housing 330A is provided with a partition wall 333 in which the plurality of the contact terminals 310 are held by press-fitting, the end face of the connector housing is of trapezoid shape. The long bottom side of the trapezoid is fixed to one side of the circuit board 300A, a portion of the circuit board 300A jutting out from the one side opposes the base 200A across the second sealing gap, and a short top side and left and right oblique sides of the trapezoid oppose an inner surface of a lateral opening 413 of the cover 400A across the first sealing gap.

The cover 400A is provided with a pair of first sealing concave surface sections 431A, which constitute part of a cover-side gap surface of the first sealing gap, opposing a pair of trapezoid oblique side sections of the connector housing 330A, and with a third sealing concave surface section 403A, which constitutes a cover-side gap surface of the third sealing gap, opposing the base 200A.

A second sealing concave surface section 322A is provided on the long bottom side of the connector housing 330A, which forms the second sealing gap, opposing the base 200A. The second sealing concave surface section 322A and the third sealing concave surface section 403A communicate with each other to form a concave surface section of an annular sealing gap.

The cover 400A is further provided with overlap reservoirs 417a, 417b into which part of the waterproof sealing material 501, 502, 503 flows, and with replenishing inclined surface sections 419 that are provided in trapezoid oblique side sections 413a of the cover 400A and that are parallel to the first sealing concave surface sections 431A, at connection and merging positions of the first sealing concave surface sections 431A and the third sealing concave surface section 403A.

The waterproof sealing material 501 for the first sealing gap is applied turning around at a first sealing gap surface and the replenishing inclined surface sections 419 of the cover 400A, via the overlap reservoirs 417a, 417b.

The overlap reservoirs include an outer overlap reservoir 417b and an inner overlap reservoir 417a configured by widening of the concave surface width of the third sealing concave surface section, at the connection and merging position of the first sealing concave surface sections 431A and the third sealing concave surface section 403A.

The inner overlap reservoir 417a is a shelf passage through which there passes a U-shaped turn-back portion 501y of the waterproof sealing material 501 that fills the first sealing gap.

A replenishing end section 501z of the waterproof sealing material 501 is applied to the replenishing inclined surface sections 419, which are part of the trapezoid oblique side sections 413a, by turning around at the inner overlap reservoir 417a.

As described above, in an aspect pertaining to claim 2 of the present invention, the overlap reservoirs are provided on the outer side and the inner side of a waterproof seal region, and the inner overlap reservoir constitutes a shelf passage that corresponds to an intermediate depth position between a recess bottom face of the first sealing concave surface sections provided on the trapezoid oblique sides of the cover, and an upper plane at which the concave surface is generated. As a characterizing feature of this aspect, therefore, the inner overlap reservoir functions herein as a spiral staircase for causing the waterproof sealing material, having been applied to the first sealing concave surface sections, to make a U-turn and be guided to the replenishing inclined surface sections; thus, upon attachment of the base, the U-shaped turn-back portion of the waterproof sealing material is compressed and deformed, and the material flows into the inner overlap reservoir. The sealing performance at the connection and merging position can be enhanced as a result.

In the connection and merging position, the center lines of the first sealing concave surface sections 431A are provided further inward than the center line of the third sealing concave surface section 403A to be mutually connected; accordingly, the depth of the outer overlap reservoir 417b is equal to or greater than the depth of the third sealing concave surface section 403A.

In an aspect pertaining to claim 3 of the present invention, as described above, the first sealing concave surface sections of the trapezoid oblique side sections are provided further inward than the third sealing concave surface section; accordingly, the depth of the outer overlap reservoir is equal to or greater than the depth of the third sealing concave surface section.

As a characterizing feature of this aspect, therefore, the first sealing concave surface sections can be formed inside the third sealing concave surface section, even when the latter is a smooth arcuate shape, at the connection and merging positions of the first sealing concave surface sections and the third sealing concave surface section; accordingly, the cover can be molded easily, and the width of the outer overlap reservoir is widened through shifting of the central position; upon attachment of the base, thus, the waterproof sealing material is pressed to flow inward, and the sealing performance at the connection and merging position can be enhanced thereby.

The same is true in Embodiment 2.

The assembly relative position of the connector housing 330A and the cover 400A is regulated by mutual fitting of a pair of fitting holes 416b, provided in one of the connector housing 330A and the cover 400A, and positioning protrusions provided in the other.

A pair of gap-regulating walls 414 is provided in the pair of trapezoid oblique side sections of the cover 400A that makes up part of the first sealing gap, the gap-regulating walls 414 being disposed parallelly to the inner sides of the replenishing inclined surface sections 419.

In an aspect pertaining to claim 4 of the present invention, as described above, the assembly relative position of the connector housing and the cover is regulated by positioning protrusions and fitting holes thereof, and the trapezoid oblique side sections that constitute part of the first sealing gap are regulated by the gap-regulating walls. As a characterizing feature of this aspect, therefore, it becomes possible to suppress variability in the assembly dimension of the first sealing gap, and to suppress inflow, into a waterproof internal space, of a replenishing end section of the waterproof sealing material that is applied to the replenishing inclined surface sections.

First protrusions 304 and third protrusions 404 are provided in the first sealing gap and the third sealing gap. The first protrusions 304, which are provided at one of opposing surfaces on either one of the lateral opening 413 of the cover 400A and the short top side section of the connector housing 330A, are gap-setting protrusions that prevent the first sealing gap from being excessively small.

The third protrusions 404, which are provided at one of opposing surfaces of the three outer peripheral sides of the cover 400A and the base 200A, are gap-setting protrusions that prevent the third sealing gap from becoming excessively small. Upon fastening and clamping of the circuit board 300A by the cover 400A and the base 200A, the third protrusions 404 that regulate the third sealing gap abut opposing surfaces of the cover 400A and the base 200A, in a state where part of the curved dimension of the circuit board 300A having undergone curving deformation is straightened through compression of the circuit board 300A. The gap dimension of the third sealing gap is determined by the height dimension of these gap-setting protrusions.

In an aspect pertaining to claim 5 of the present invention, as described above, the gap dimension of at least the first sealing gap and the third sealing gap, among the sealing gaps filled with the waterproof sealing material, is regulated by the first and third protrusions, and the gap dimension of the clamping surfaces that clamp the circuit board is regulated through the concomitant use of the third protrusions. The gap dimension of the clamping surfaces of the circuit board is larger than a flat thickness dimension of the circuit board. As a characterizing feature of this aspect, therefore, fastening screws of the base and the cover can be tightened, and the occurrence of screw loosening is prevented, even when the circuit board undergoes curving deformation. The waterproof sealing material that fills the third sealing gap flows into the curvedly deformed portion of the circuit board, and hence the occurrence of wobbling is prevented by the filling waterproof sealing material even upon gradual straightening and flattening of the curving deformation of the circuit board in the stage of practical use.

The method for assembling a waterproof-type control unit comprises
a first process step 1202 of mounting the cover 400A, in a flipped state, on a jig, and applying a paste-like waterproof sealing material 501, which is divided into a first sealing material 501a and a second sealing material 501b, onto a seal surface that makes up a first sealing gap of the cover 400A, in a non-annular fashion; a second process step 1203c of mounting a circuit board 300A, on which circuit components 311a, 311b and a connector housing 330A are mounted beforehand and which has undergone mounting soldering, on an installation shelf stepped portion provided on three sides of the outer periphery of the cover 400A, to join thereby the connector housing 330A and the cover 400A;

a third process step 1204 of applying a paste-like waterproof sealing material 503, 502, in a ring-like fashion, onto seal surfaces that make up a third sealing gap of the cover 400A and a second sealing gap of the connector housing 330A, which have completely undergone the second process step 1203c; and a fourth process step 1205b of mounting a base 200A on the cover 400A having completely undergone the third process step 1204, integrally fixing the cover 400A and the base 200A, and clamping and fixing the circuit board 300A with three outer peripheral sides of the cover 400A and the base 200A, wherein the first and second sealing materials 501a, 501b are applied turning around in a U-shape, with an intermediate portion of a trapezoid short top side section 413b in a lateral opening 413 of the cover 400A as a start point or end point, and with replenishing inclined surface sections 419 that are parallel to first sealing concave surface sections 431A provided in a pair of trapezoid oblique side sections 413a, as an end point or start point, and after the fourth process step 1205b is over, the paste-like waterproof sealing material 501, 502, 503 is dried and cured by being left to stand at normal temperature or through heating, while performing visual inspection and performance inspection.

In the third process step 1204, a beginning 503a and a terminal 503b of an annular sealing material, which is the waterproof sealing material that is applied in an ring-like fashion, are provided in the third sealing gap; a board cutout 313 is provided in the circuit board 300A; and the board cutout 313 is provided at a position adjacent to the beginning 503a and the terminal 503b of the annular sealing material, and constitutes an overlap reservoir into which excess sealing material at an overlap portion flows, upon mounting of the base 200A in the fourth step 1205b.

In an aspect pertaining to claim 7 of the present invention, as described above, a board cutout is provided at a start point and an end point position of a waterproof sealing material that is applied, in a ring-like fashion, on a second sealing gap and a third sealing gap.

As a characterizing feature of this aspect, therefore, the board cutout constitutes an overlap reservoir into which there flows excess sealing material, and can also be utilized in order to pry open the circuit board, the edge of a screwdriver being inserted thereto, when disassembling the circuit board. The same is true in Embodiment 2.

As the circuit component, the circuit board 300A has an inner surface circuit component 311a that is mounted on the face of the circuit board 300A opposing the cover 400A, or an outer surface circuit component 311b that is mounted on the face of the circuit board 300A opposing the base 200A. When the base 200A has a first heat-transfer seat 361a adjacent to the rear face of the inner surface circuit component 311a or a second heat-transfer seat 361b adjacent to the outer surface circuit component 311b, the second process step 1203c includes an additional process step of applying a paste-like thermally conductive adhesive 511a, 511b to the surface of the circuit board 300A or the surface of the outer surface circuit component 311b, opposing the first or second heat-transfer seat 361a, 361b, or comprises A preliminary process step 1205a of applying the paste-like thermally conductive adhesive 511a, 511b to the surface of the first or second heat-transfer seat 361a, 361b, prior to the fourth process step 1205b.

The base 200A is a high thermal conductivity member made of sheet metal, and the cover 400A is made of sheet metal.

In the trapezoidal short top side section 413b of the lateral opening 413 of the cover 400A, there is formed: a first sealing cover top side section 401A having a terrace-like inclined surface section or being an extension of the first sealing concave surface sections 431A, while in the short top side section of the connector housing 330A there is formed a first sealing top side section 301A having a terrace-like inclined surface section or being an extension of the first sealing convex surface sections 321A provided in the trapezoid oblique side sections of the connector housing 330A. The first sealing top side section makes up part of the first sealing gap opposing the first sealing cover top side section 401A;

and an enclosed space configured by the base 200A, the connector housing 330A and the cover 400A communicates with outside air via a waterproof filter 201 having porous vent holes and being impervious to water.

In a case where the circuit components mounted on the circuit board are heat-generating components in an aspect pertaining to claim 8 of the present invention, as described above, a thermally conductive adhesive is applied between a heat-transfer seat provided on the base and the heat-generating components or the rear face of the latter, and the base, which is a high thermal conductivity member, is assembled thereafter. The enclosed space configured by the base, the connector housing and the cover communicates as a result with outside air via the waterproof filter.

As a feature of this aspect, therefore, it becomes possible to suppress rises in the temperature of the circuit components and within the enclosed space, through enhanced heat dissipation from the heat-generating components, while waterproof sealability can be secured as a result of a breathing action in the enclosed space, even when the cover is made of sheet metal or of a resin.

As a further characterizing feature of this aspect, the entirety of the first sealing gap, including the replenishing inclined surface sections, does not constitute a steep-angle, high-density uneven seal surface, and hence a shared connector housing can be used for the cover made of sheet metal or of resin.

Embodiment 2

(1) Detailed Explanation of the Configuration

Embodiment 2 of the present invention will be explained in detail next focusing on differences with respect to the waterproof-type control unit of FIG. 1 to FIG. 6, with reference to FIG. 13 being an external-view diagram of the waterproof-type control unit according to Embodiment 2 of the present invention, to FIG. 14 being an attachment cross-sectional diagram of the waterproof-type control unit of FIG. 13, and to FIG. 15A and FIG. 15B being partial cross-sectional diagrams illustrating a connector housing of the waterproof-type control unit of FIG. 13.

In the figures, identical reference symbols denote identical or corresponding portions; herein, the uppercase letter A denotes reference symbols corresponding to Embodiment 1 and the uppercase letter B denotes reference symbols corresponding to Embodiment 2.

Figure 13:
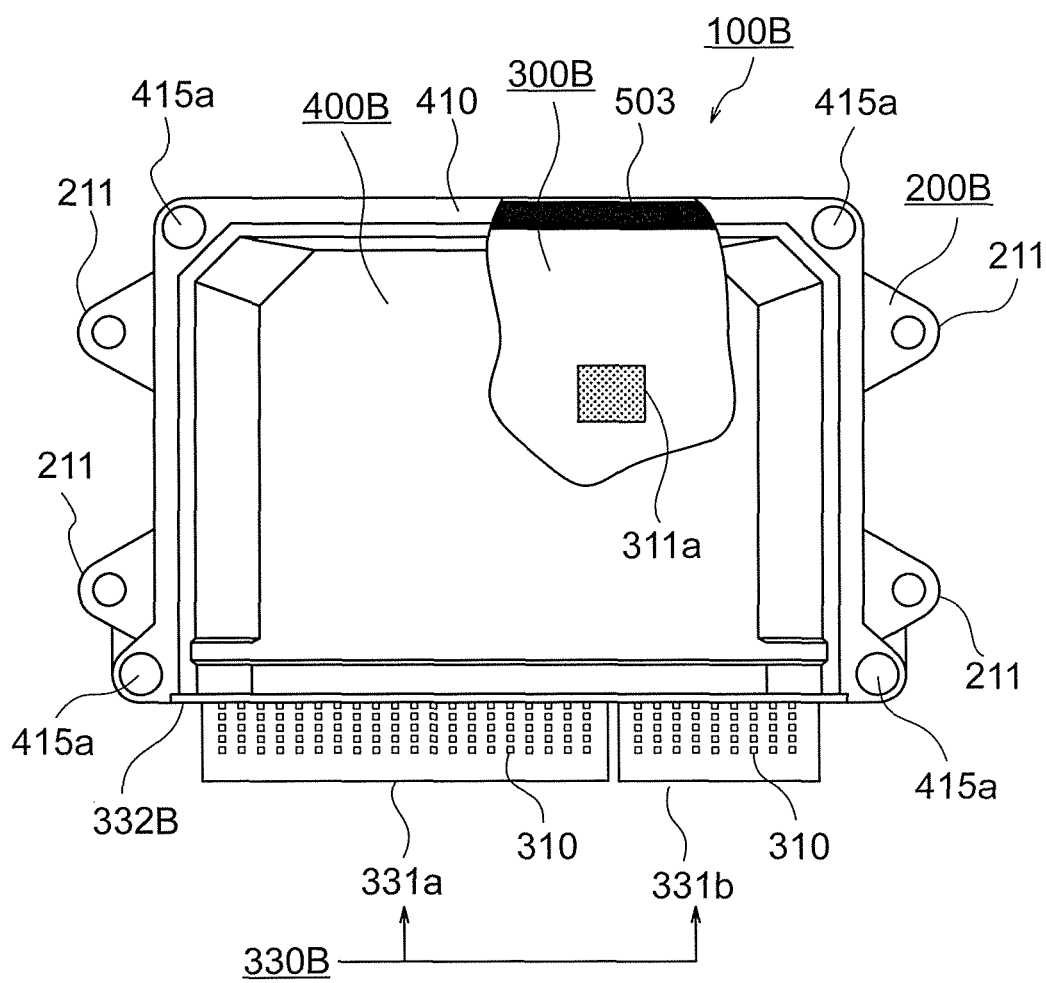
FIG. 13 is an external-view diagram of the waterproof-type control unit according to Embodiment 2 of the present invention.

In FIG. 13, a waterproof-type control unit 100B is configured out of a base 200B, produced by aluminum die-casting and having mounting feet 211 on four sides; a circuit board 300B having mounted thereon a plurality of circuit components 311a, 311b; and a resin-made cover 400B having a flange-like flange 410 on three sides of the outer peripheral wall portion. The outer peripheral wall portion on the remaining side is missing, and constitutes a lateral opening 413 (see FIG. 15A) that is blocked by a connector housing 330B.

A connector housing 330B with which first and second connector housings 331a, 331b are integrally formed is attached to one side of the circuit board 300B.

Figure 15A:
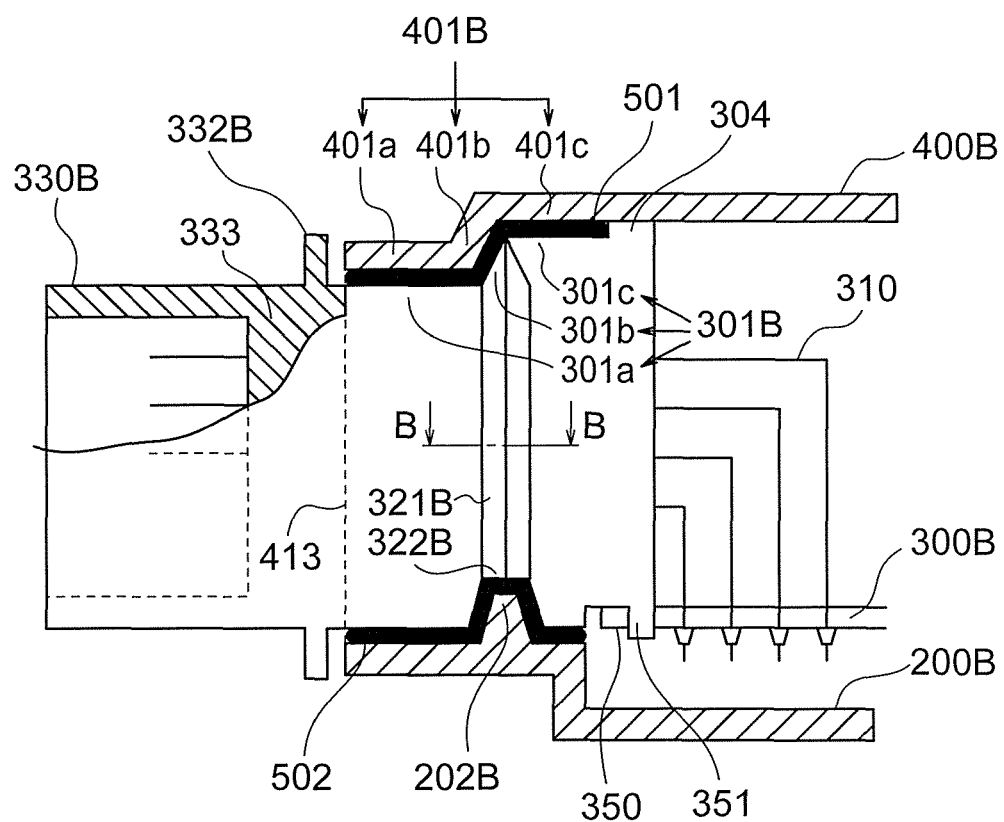
FIG. 15A is a side-view diagram of a connector housing, being a diagram illustrating a connector housing of the waterproof-type control unit of FIG. 13.

An annular peripheral wall 332B described below in FIG. 15A is projectingly provided on the outer periphery of the first and second connector housings 331a, 331b.

In FIG. 14, an attachment screw 102 that attaches and fixes the waterproof-type control unit 100B to the attachment surface 101 is inserted in a clearance hole of each of the four mounting feet 211 that are provided in the base 200B, and is screwed into a screw hole that is provided in the attachment surface 101.

The joining faces of the three outer peripheral sides of the cover 400B and the base 200B have a plurality of adjacent ridges and recessed stripes that engage with each other, to configure thereby an uneven seal surface onto which a waterproof sealing material 503 is applied. The cover 400B and the base 200B are fastened and fixed together by fixing screws 213, not shown (FIG. 6), from the rear face of the base 200B (FIG. 6), using screw holes 415b not shown (FIG. 6) that are provided on the inner surface of the screw hole protruding portions 415a of FIG. 13, which are in turn provided at the four corners of the cover 400B.

Herein, the cover 400B and the base 200B abut the third protrusions 204, whereby there is determined the gap dimension of the third sealing gap onto which the waterproof sealing material 503 is applied.

Three sides of the circuit board 300B are clamped by the cover 400B and the base 200B, while a board cutout 313 is provided on one remaining side.

The circuit board 300B has an inner surface circuit component 311a mounted on the face of the circuit board 300B opposing the cover 400B, or an outer surface circuit component 311b mounted on the face of the circuit board 300B opposing the base 200B. The base 200B has a first heat-transfer seat 361a adjacent to the rear face of the inner surface circuit component 311a or a second heat-transfer seat 361b adjacent to the outer surface circuit component 311b; herein, a paste-like thermally conductive adhesive 511a, 511b is applied to the surface of the circuit board 300B, or the surface or the outer surface circuit component 311b, opposing the first or second heat-transfer seat 361a, 361b.

The thermally conductive adhesive 511a, 511b can be applied beforehand onto the surface of the first or second heat-transfer seat 361a, 361b.

Figure 15B:
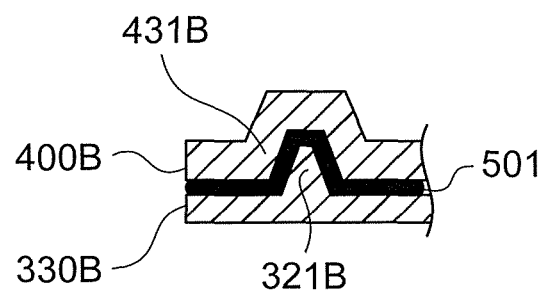
FIG. 15B is a local cross-sectional diagram of FIG. 15A along line B-B.

FIG. 15A is a side-view diagram of the connector housing 330B, and FIG. 15B is a local cross-sectional diagram of FIG. 15A along line B-B.

In FIG. 15A, the connector housing 330B that represents the first and second connector housings 331a, 331b is provided with the annular peripheral wall 332B described above in FIG. 13, and with a partition wall 333 into which contact terminals 310 of right-angle type are pressed.

Board holes 350 are provided on both sides of the left of the circuit board 300B having one end of each of the contact terminals 310 soldered thereonto. Positioning protruding pieces 351, being for instance snap pins that are pressed into the connector housing 330B, are fitted into the board holes. The attachment relative position between the connector housing 330B and the circuit board 300B is regulated as a result. The exposed end face of the connector housing 330B is of trapezoid shape. On the left and right oblique sides of the trapezoid of the connector housing 330B there are formed a pair of first sealing convex surface sections 321B, left and right (front and rear of the paper in FIG. 15A) that are projectingly provided in the connector housing 330B, and a pair of uneven engagement surfaces configured out of left and right first sealing concave surface sections 431B of the cover 400B and that loosely fit with the foregoing convex surface sections.

A first sealing cover top side section 401B, configured of an outer step flat portion 401a, a terrace-like inclined surface section 401b and an inner step flat portion 401c, is provided on the lateral opening 413 of the cover 400B at which part of the connector housing 330B is exposed. Thereby, a first sealing gap is configured opposing a first sealing top side section 301B that is made up of an outer step flat portion 301a, a terrace-like inclined surface section 301b and an inner step flat portion 301c, on the connector housing 330B side. The waterproof sealing material 501 is applied to this first sealing gap.

A plurality of gap-setting protrusions 304 are projectingly provided, abutting the inner surface of the cover 400B, at the inner end face position of the inner step flat portion 301c of the connector housing 330B. The gap-setting protrusions 304 prevent the first sealing gap from becoming excessively small. The gap-setting protrusions 304 may be provided on the inner surface side of the cover 400B, or may be provided on the outer step flat portion 301a of the connector housing 330B or the outer step flat portion 401a of the cover 400B.

At the first sealing top side section 301B, first sealing convex surface sections 321B of the left and right trapezoid oblique side sections may extend and be connected to the short top side section; accordingly, first sealing concave surface sections 431B of the trapezoid oblique side sections, left and right, may extend and be connected to the short top side section in the first sealing cover top side section 401B as well.

A second sealing concave surface section 322B that constitutes a second sealing gap between the connector housing 330B and the base 200B is provided on the bottom face of the connector housing 330B. A second sealing convex surface section 202B that loosely fits with the second sealing concave surface section 322B is provided on the left side of the base 200B. A waterproof sealing material 502 is applied to a second sealing gap that is made up of the second sealing concave surface section 322B and the second sealing convex surface section 202B.

In the second sealing gap there is provided a gap-setting protrusion, not shown, that is provided between the connector housing 330B and the base 200B.

The second sealing gap can be regulated on the basis of the height of the attachment surface of the circuit board 300B and the base 200B. Gap setting protrusions for the second sealing gap can be omitted in that case.

The annular peripheral wall 332B provided in the connector housing 330B, and which opposes the lateral opening 413 of the cover 400B and the left side end face of the base 200B, across a gap therebetween, prevents outflow of the waterproof sealing material 501, 502 and constitutes a window for monitoring whether the waterproof sealing material 501, 502 is properly filled in or not.

The detailed configuration of the waterproof-type control unit according to Embodiment 2 will be explained next with reference to FIG. 16, being an internal-view diagram illustrating part of the cover 400B of the waterproof-type control unit of FIG. 13, to FIG. 17 being a partial enlarged-view diagram of FIG. 16, and to FIG. 18 being an enlarged-view diagram after application of a sealing material in FIG. 17, in this order.

Figure 16:
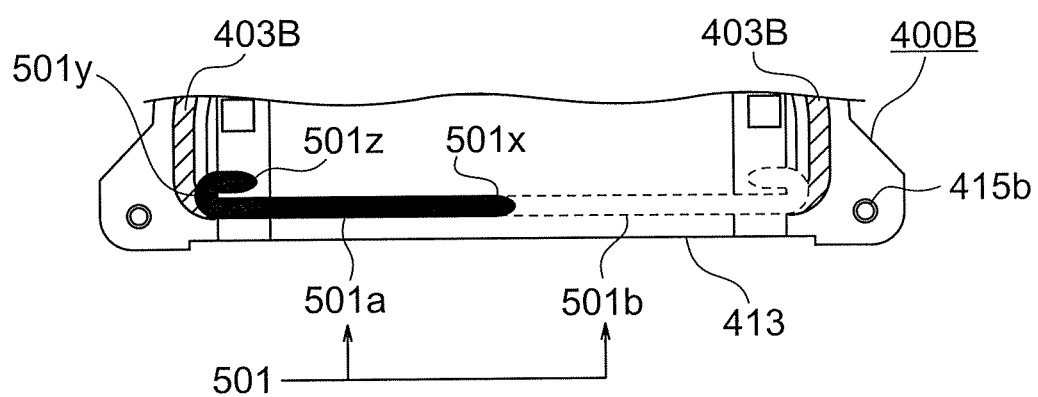
FIG. 16 is an internal-view diagram illustrating part of a cover of the waterproof-type control unit of FIG. 13.
Figure 17:
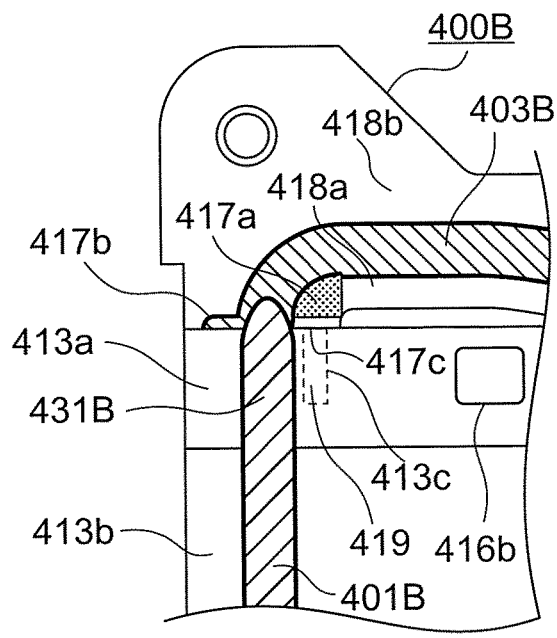
FIG. 17 is a partial enlarged-view diagram of FIG. 16.
Figure 18:
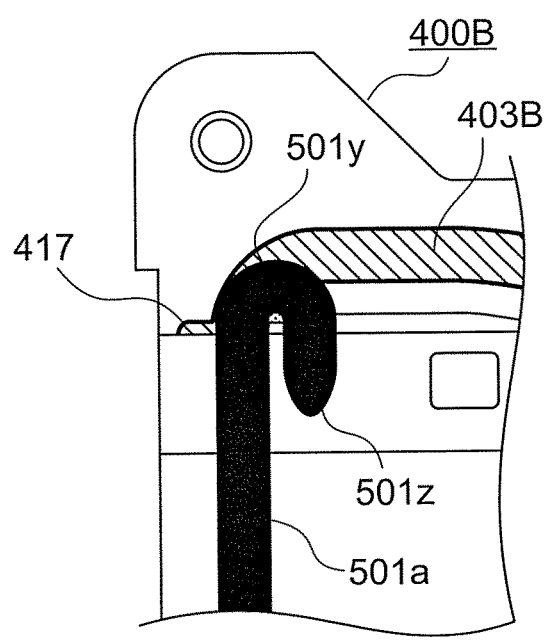
FIG. 18 is an enlarged-view diagram after application of a sealing material in FIG. 17.

FIG. 16 to FIG. 18 are diagrams that incorporate FIG. 7 to FIG. 9 of Embodiment 1. Differences with respect to FIG. 7 to FIG. 9 will be explained herein.

In FIG. 16, the waterproof sealing material 501 is applied, divided into a first sealing material 501a and a second sealing material 501b, on the inner surface of the lateral opening 413 of the cover 400B, similarly to the case of FIG. 7. The first and second sealing materials 501a, 501b have a tapering overlap portion 501x, a U-shaped turn-back portion 501y and a replenishment end section 501z.

In FIG. 17, similarly to the case of FIG. 8, an (inner) overlap reservoir 417a, an overlap reservoir (inner deep portion) 417c and an overlap reservoir (outer deep portion) 417b are provided at a connection and merging position of the third sealing concave surface section 403B and the first sealing concave surface sections 431B that are provided in the cover 400B.

The inner overlap reservoir 417a constitutes a sloping passage that connects the level difference from the trough surface portion of the third sealing concave surface section 403B up to the surface of the surface section 418a on the inner of the cover 400B.

The overlap reservoir 417b is an outer deep portion that is carved, to a depth identical to that of the trough surface portion of the third sealing concave surface section 403B, in the surface of the outer flat surface section 418b.

The overlap reservoir 417c is an inner deep portion that is carved, to a depth identical to that of the trough surface portion of the third sealing concave surface section 403B, at an end section of the sloping passage of the overlap reservoir 417a.

Similarly, the first sealing concave surface sections 431B and the first sealing cover top side section 401B are carved in the trapezoid oblique side sections 413a and the short top side section 413b at the inner surface of the lateral opening 413 of the cover 400B; herein, the first sealing concave surface sections 431B connect and merge with the third sealing concave surface section 403B at a trough surface of the latter.

In this connection and merging position, the center lines of the first sealing concave surface sections 431B are provided further inward than the center line of the third sealing concave surface section 403B to be mutually connected; thereby, the first sealing concave surface sections 431B can be formed inside the third sealing concave surface section 403B, even if the third sealing concave surface section 403B is a smooth arcuate shape.

A shallow bottom groove 413c is provided on replenishing inclined surface sections 419, on the inner of the trapezoid oblique side section 413a; the replenishment end section 501z of sealing material can be applied stably as a result. In FIG. 18, the first sealing material 501a is applied turning around in the form of a U-shape, with a start point (or end point) at an intermediate portion of the trapezoid short top side section 413b at the lateral opening 413 of the cover 400B, and with the end point (or start point) at the replenishing inclined surface sections 419 that run parallel to the first sealing concave surface sections 431B provided in the trapezoid oblique side sections 413a. The same is true of the other second sealing material 501b.

The waterproof sealing material 501 is applied firstly to the first sealing gap surface of the cover 400B. Thereafter, upon mounting of the circuit board 300B and the connector housing 330B, the waterproof sealing material 501 is compressed and deformed by the convex surface section on the connector housing 330B side; thereby the waterproof sealing material 501 diffuses towards the outer periphery of the concave surface section, and a waterproof seal surface of a predetermined width becomes formed as a result.

However, the waterproof sealing material 501 that is applied to the upper portion of the trapezoid oblique side sections is pushed down by the connector housing 330B, and the filling density of the waterproof sealing material 501 is reduced thereby, so that a waterproof seal surface of predetermined width cannot be formed. This problem is solved through compensation by the waterproof sealing material that is applied to the replenishing inclined surface sections 419.

Upon attachment of the base 200B at the position at which the outer flat surface section 418$b$ of the cover 400B and the long bottom side of the connector housing 330B connect and merge, the U-shaped turn-back portion 501$y$ of the waterproof sealing material 501 is caused to flow, through pressure contact, into the overlap reservoir 417$b$, so that the thinned out waterproof sealing material is compensated as a result.

The same is true of the inner deep portion by the overlap reservoir 417$c$.

Figure 19:
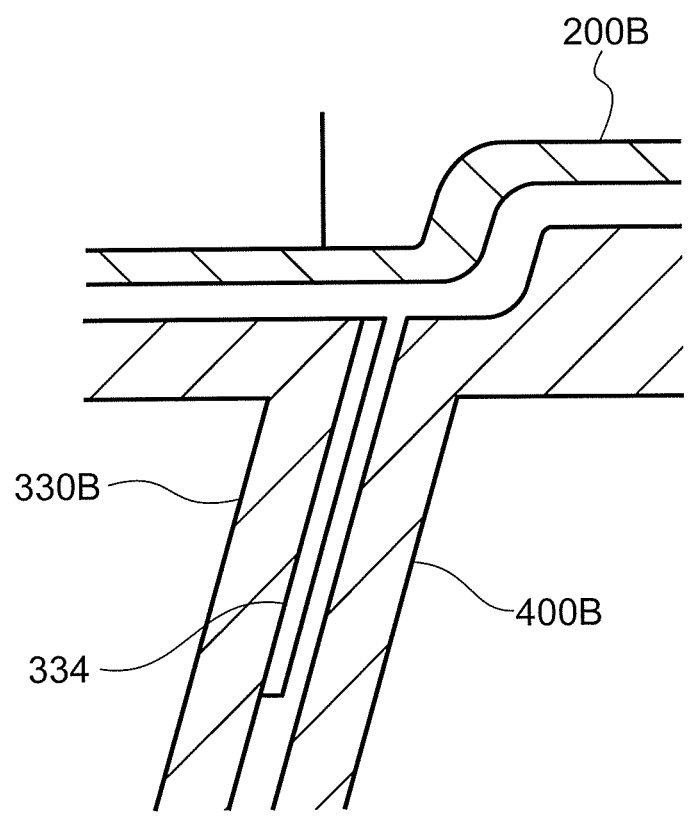
FIG. 19 is a partial enlarged-view diagram of a connector housing in the waterproof-type control unit of FIG. 13.

An explanation follows next on FIG. 19, which is a partial enlarged-view diagram of the connector housing of the waterproof-type control unit in FIG. 13.

In FIG. 19 gap-regulating walls 334 are provided at trapezoid oblique side sections of the connector housing 330B that is attached to the lateral opening 413 (FIG. 15A) of the cover 400B.

The gap-regulating walls 334 are an alternative to the gap-regulating walls 414 of FIG. 8. The gap-regulating walls 334 opposes from a close distance the trapezoid oblique side sections of the cover 400B, at positions parallel to the replenishing inclined surface sections 419 (FIG. 17).

The method for assembling the waterproof-type control unit 100B according to Embodiment 2 is identical to that of Embodiment 1 explained with reference to FIG. 12. In the explanation above, the base 200B is produced by aluminum die-casting, and the cover 400B is made of a resin, but the foregoing may be produced out of sheet metal, as in the case of Embodiment 1. Conversely, the waterproof-type control unit of Embodiment 1 can be modified in the manner of Embodiment 2.

In Embodiments 1 and 2, the first sealing top side section 301A, 301B and the first sealing cover top side section 401A, 401B that are provided at the short top side section of the connector housing 330A, 330B and the short top side section of the cover 400A, 400B, opposing the foregoing, may be configured according to the terrace-like inclined surface scheme explained in FIG. 2, FIG. 4 and FIG. 15A, or according to an uneven seal surface scheme similar to that of the trapezoid oblique side sections.

Silicone bonding is suitable as the waterproof sealing material 501, 502, 503, but epoxy or acrylic bonding can alternatively be resorted to.

The waterproof sealing material 501, 502, 503 can be used, as it is, as the thermally conductive adhesive 511$a$, 511$b$, but a silicone adhesive comprising a thermally conductive filler is ordinarily used as the thermally conductive adhesive 511$a$, 511$b$, in order to achieve better thermal conductivity.

(2) Explanation of Other Embodiments

An explanation follows next on FIG. 20, which is a cross-sectional diagram of a waterproof-type control unit according to a first variation of the present invention, focusing on differences with respect to the waterproof-type control unit of FIG. 2.

As in the case of the first sealing top side section 301B of FIG. 15A, the first sealing top side section 301A of FIG. 2 is made up of the outer step flat portion 301$a$, the terrace-like inclined surface section 301$b$ and the inner step flat portion 301$c$. The first sealing cover top side section 401A (FIG. 4) that opposes the first sealing top side section 301A is made up of the outer step flat portion 401$a$, the terrace-like inclined surface section 401$b$ and the inner step flat portion 401$c$, similarly to the first sealing cover top side section 401B in FIG. 15A.

In FIG. 20, which illustrates a variation of the first sealing top side section 301A and the first sealing cover top side section 401A, by contrast, the first sealing top side section 301A is an unmodified extension of the first sealing convex surface sections 321A of the trapezoid oblique side sections, up to the short top side section, and the first sealing cover top side section 401A is an unmodified extension of the first sealing concave surface sections 431A of the trapezoid oblique side sections, up to the short top side section.

Figure 21:
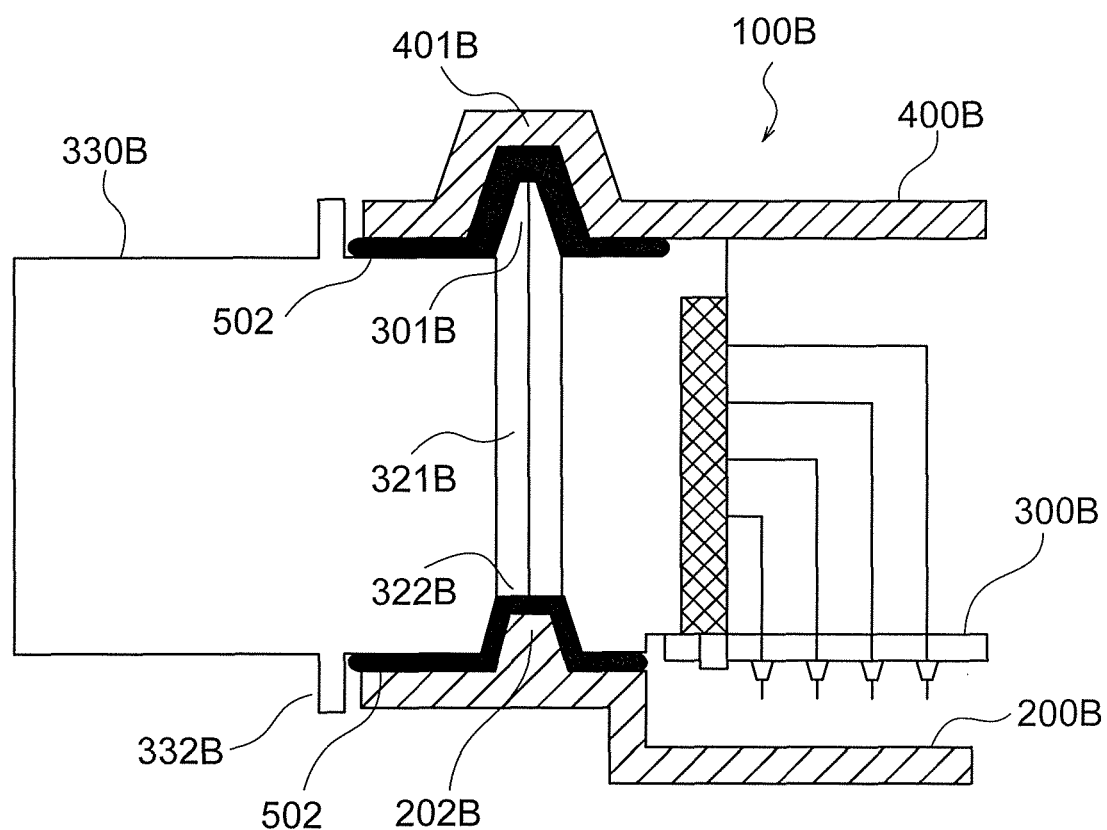
FIG. 21 is a cross-sectional diagram of a waterproof-type control unit according to a second variation of the present invention.

An explanation follows next on FIG. 21, which is a cross-sectional diagram of a waterproof-type control unit according to a second variation of the present invention, focusing on differences with respect to the waterproof-type control unit of FIG. 15A.

The first sealing top side section 301B in FIG. 15A is made up of the outer step flat portion 301$a$, the terrace-like inclined surface section 301$b$ and the inner step flat portion 301$c$. The first sealing cover top side section 401B that opposes the first sealing top side section 301B is made up of the outer step flat portion 401$a$, the terrace-like inclined surface section 401$b$ and the inner step flat portion 401$c$.

In FIG. 21, which illustrates a variation of the first sealing top side section 301B and the first sealing cover top side section 401B, by contrast, the first sealing top side section 301B is merely an unmodified extension of the first sealing convex surface sections 321B of the trapezoid oblique side sections, up to the short top side section, and the first sealing cover top side section 401B is an unmodified extension of the first sealing concave surface sections 431B of the trapezoid oblique side sections, up to the short top side section.

In both cases, the center lines of the first sealing gap and the second sealing gap that surround the body part of the connector housing 330A, 330B run along an identical line, while the plurality of ridges and recessed stripes are not arrayed parallelly in the body part of the connector housing 330A, 330B.

Therefore, it becomes possible to suppress lengthening of the connector housing 330A, 330B, even in a case where the cover 400A, 400B is of sheet metal and thus steep-angled ridges and recessed stripes cannot be formed therein.

In a case where the first sealing top side section 301A, 301B and the first sealing cover top side section 401A, 401B have the terrace-like inclined surface sections 301$b$, 401$b$, the center lines of the foregoing constitute respective boundary positions between the terrace-like inclined surface sections 301$b$, 401$b$ and the inner step flat portions 301$c$, 401$c$.

(3) Gist and Features of Embodiment 2

As made apparent in the above explanation, the waterproof-type control unit 100B according to Embodiment 2 of the present invention, a casing in which a circuit board 300B is hermetically accommodated is made up of a base 200B, a cover 400B and a connector housing 330B, as in the case of Embodiment 1; in the casing, a waterproof sealing material 501, 502, 503 is applied so as to fill a first sealing gap made up of opposing surfaces of a lateral opening 413 of the cover 400B and a short top side and a pair of oblique sides of the trapezoidal connector housing 330B, a second sealing gap made up of opposing surfaces of a long bottom side of the connector housing 330B and the base 200B, and a third sealing gap made up of opposing surfaces of the cover 400B and the base 200B; in this waterproof sealing material 501, 502, 503, the waterproof sealing material 501 that is applied to the first sealing gap surface is applied turning around also at replenishing inclined surface sections 419 that is provided on trapezoid oblique side sections 413*a* of the cover, via overlap reservoirs 417*a*, 417*b* that are provided at a boundary position between the first sealing gap surface and a third sealing gap surface.

The overlap reservoirs include an outer overlap reservoir 417*b* and an inner overlap reservoir 417*a* configured by widening of the concave surface width of the third sealing concave surface section, at the connection and merging position of the first sealing concave surface sections 431B and the third sealing concave surface section 403B.

The inner overlap reservoir 417*a* is a sloping passage through which there passes a U-shaped turn-back portion 501*y* of the waterproof sealing material 501 that fills the first sealing gap.

A replenishing end section 501*z* of the waterproof sealing material 501 is applied to the replenishing inclined surface sections 419, which are part of the trapezoid oblique side sections 413*a*, by turning around at the inner overlap reservoir 417*a*.

In an aspect pertaining to claim 2 of the present invention, as described above, overlap reservoirs are provided on the outer side and the inner side of a waterproof seal region, and the inner overlap reservoir constitutes a shelf passage that corresponds to an intermediate depth position between a recess bottom face of the first sealing concave surface sections provided on the trapezoid oblique sides of the cover, and an upper plane at which the concave surface is generated, or constitutes a sloping passage that joins a concave surface bottom with the upper plane.

As a characterizing feature of this aspect, therefore, the inner overlap reservoir functions herein as a spiral slope for causing the waterproof sealing material, having been applied to the first sealing concave surface sections, to make a U-turn and be guided to the replenishing inclined surface sections; thus, upon attachment of the base, the U-shaped turn-back portion of the waterproof sealing material is compressed and deformed, and the material flows into the inner overlap reservoir. The sealing performance at the connection and merging position can be enhanced as a result.

The assembly relative position of the connector housing 330B and the cover 400B is regulated by mutual fitting of a pair of fitting holes 416*b*, provided in one of the connector housing 330B and the cover 400B, and positioning protrusions provided in the other. A pair of gap-regulating walls 334 is provided in the pair of trapezoid oblique side sections of the connector housing 330B that makes up part of the first sealing gap, the gap-regulating walls 334 being disposed parallelly to the inner sides of the replenishing inclined surface sections 419.

In an aspect pertaining to claim 4 of the present invention, as described above, the assembly relative position of the connector housing and the cover is regulated by positioning protrusions and fitting holes thereof, and the trapezoid oblique side sections that constitute part of the first sealing gap are regulated by the gap-regulating walls. As a characterizing feature of this aspect, therefore, it becomes possible to suppress variability in the assembly dimension of the first sealing gap, and to suppress inflow, into a waterproof internal space, of a replenishing end section of the waterproof sealing material that is applied to the replenishing inclined surface sections, as in Embodiment 1.

A first protrusions 304 and third protrusions 204 are provided in the first sealing gap and the third sealing gap. The first protrusions 304, which are provided at one of opposing surfaces of the lateral opening 413 of the cover 400B and the short top side section of the connector housing 330B, are gap-setting protrusions that prevent the first sealing gap from being excessively small.

The third protrusions 204, which are provided at one of opposing surfaces of the three outer peripheral sides of the cover 400B and the base 200B, are gap-setting protrusions that prevent the third sealing gap from becoming excessively small. Upon fastening and clamping of the circuit board 300B by the cover 400B and the base 200B, the third protrusions 204 that regulate the third sealing gap abut opposing surfaces of the cover 400B and the base 200B, in a state where part of the curved dimension of the circuit board 300B having undergone curving deformation is straightened through compression of the circuit board 300B. The gap dimension of the third sealing gap is determined by the height dimension of this gap-setting protrusion.

In an aspect pertaining to claim 5 of the present invention, as described above, the gap dimension of at least the first sealing gap and the third sealing gap, among the sealing gaps filled with the waterproof sealing material, is regulated by the first and third protrusions, and the gap dimension of the clamping surfaces that clamp the circuit board is regulated through the concomitant use of the third protrusions. The gap dimension of the clamping surfaces of the circuit board is larger than a flat thickness dimension of the circuit board. As a characterizing feature of this aspect, therefore, as in Embodiment 1, fastening screws of the base and the cover can be tightened, and the occurrence of screw loosening is prevented, even when the circuit board undergoes curving deformation. The waterproof sealing material that fills the third sealing gap flows into the curvedly deformed portion of the circuit board, and hence the occurrence of wobbling is prevented by the filling waterproof sealing material even upon gradual straightening and flattening of the curving deformation of the circuit board in the stage of practical use.

As made apparent in the above explanation, the method for assembling a waterproof-type control unit according to Embodiment 2 of the present invention involves, as in the case of Embodiment 1, applying the waterproof sealing material 501 onto a seal surface that makes up the first sealing gap of the cover 400B; mounting thereafter the circuit board 300B having the connector housing 330B; applying next, in a ring-like fashion, the waterproof sealing material 502, 503 onto a seal surface that makes up the third sealing gap of the cover 400B and the second sealing gap of the connector housing 330B; thereafter, connecting the foregoing two, integrally fixing the whole, and performing thereafter visual inspection and performance inspection, wherein the waterproof sealing material that fills the first sealing gap is applied, divided into a first sealing material 501*a* and a second sealing material 501*b*, in a non-annular fashion.

As the circuit component, the circuit board 300B has an inner surface circuit component 311*a* that is mounted on the face of the circuit board 300B opposing the cover 400B, or an outer surface circuit component 311*b* that is mounted on the face of the circuit board 300B opposing the base 200B.

When the base 200B has a first heat-transfer seat 361a adjacent to the rear face of the inner surface circuit component 311a or a second heat-transfer seat 361b adjacent to the outer surface circuit component 311b, the second process step 1203c includes an additional process step of applying a paste-like thermally conductive adhesive 511a, 511b to the surface of the circuit board 300B or the surface of the outer surface circuit component 311b, opposing the first or second heat-transfer seat 361a, 361b, or comprises a preliminary process step 1205a of applying the paste-like thermally conductive adhesive 511a, 511b to the surface of the first or second heat-transfer seat 361a, 361b, prior to the fourth process step 1205b.

The base 200B is an aluminum die-cast high thermal conductivity member, and the cover 400B is made of resin.

In the trapezoidal short top side section 413b of the lateral opening 413 of the cover 400B, there is formed a first sealing cover top side section 401B having a terrace-like inclined surface section or being an extension of the first sealing concave surface sections 431B, while in the short top side section of the connector housing 330B there is formed a first sealing top side section 301B having a terrace-like inclined surface section or being an extension of the first sealing convex surface sections 321B provided in the trapezoid oblique side sections of the connector housing 330B. The first sealing top side section makes up part of the first sealing gap opposing the first sealing cover top side section 401B, and an enclosed space configured by the base 200B, the connector housing 330B and the cover 400B communicates with outside air via a waterproof filter 201 having porous vent holes and being impervious to water.

In a case where the circuit components mounted on the circuit board are heat-generating components in an aspect pertaining to claim 8 of the present invention, as described above, a thermally conductive adhesive is applied between a heat-transfer seat provided on the base and the heat-generating components or the rear face of the latter, and the base, which is a high thermal conductivity member, is assembled thereafter. The enclosed space configured by the base, the connector housing and the cover communicates as a result with outside air via the waterproof filter.

As a feature of this aspect, therefore, it becomes possible to suppress rises in the temperature of the circuit components and within the enclosed space, through enhanced heat dissipation from the heat-generating components, while waterproof sealability can be secured as a result of a breathing action in the enclosed space, even when the cover is made of sheet metal or of a resin, as in the case of Embodiment 1.

As a further characterizing feature of this aspect, the entirety of the first sealing gap, including the replenishing inclined surface sections, does not constitute a steep-angle, high-density uneven seal surface, and hence a shared connector housing can be used for the cover made of sheet metal or of resin.

REFERENCE SIGNS LIST 100A, 100B Waterproof-type control unit
200A, 200B Base
201 Waterproof filter
202A, 202B Second sealing convex surface section
203A, 203B Third sealing convex surface section
204 Gap-setting protrusion (third protrusion)
300A, 300B Circuit board
301A, 301B First sealing top side section
304 Gap-setting protrusion (first protrusion)
310 Contact terminal
311a Inner surface circuit component
311b Outer surface circuit component
313 Board cutout
322A, 322B Second sealing concave surface section
330A, 330B Connector housing
333 Partition wall
334 Gap-regulating wall
361a, 361b First and second heat-transfer seat
400A, 400B Cover
403A, 403B Third sealing concave surface section
404 Gap-setting protrusion (third protrusion)
413 Lateral opening
413a Trapezoid oblique side section
413b Trapezoid short top side section
414 Gap-regulating wall
416b Fitting hole
417a Overlap reservoir (inner)
417b Overlap reservoir (outer deep portion)
419 Replenishing inclined surface section
431A, 431B First sealing concave surface section (trapezoid inclined surface section)
501 Waterproof sealing material (first gap)
501a First sealing material (first gap)
501b Second sealing material (first gap)
501x Tapering overlap portion
501y U-shaped turn-back portion
501z Replenishing end section
502 Waterproof sealing material (second gap)
503 Waterproof sealing material (third gap)
503a Beginning of annular sealing material
503b Terminal of annular sealing material
511a, 511b Thermally conductive adhesive
1202 First process step
1203c Second process step and additional process step
1204 Third process step
1205a Preliminary process step
1205b Fourth process step

The invention claimed is:
1. A waterproof-type control unit comprising:
a casing made up of a base and a cover; and a circuit board hermetically accommodated in the casing to which one end of each of a plurality of contact terminals for external connection, which are pressed into a connector housing that is a resin molded member, and a plurality of circuit components, are soldered and connected,
the waterproof-type control unit further comprising a waterproof sealing material that fills a first sealing gap that is provided on opposing surfaces of the connector housing and the cover, a second sealing gap that is provided on opposing surfaces of the connector housing and the base, and a third sealing gap that is provided on opposing surfaces of the base and the cover, in order to expose an end face of the connector housing, through which the plurality of contact terminals penetrate, out of the casing, wherein
the connector housing is provided with a partition wall in which the plurality of the contact terminals are held by press-fitting, the end face of the connector housing is of trapezoid shape; a long bottom side of the trapezoid is fixed to one side of the circuit board, a portion of the circuit board jutting out from one side opposes the base across the second sealing gap, and a short top side and left and right oblique sides of the trapezoid oppose an inner surface of a lateral opening of the cover across the first sealing gap;

the cover is provided with a pair of first sealing concave surface sections, which constitute part of a cover-side gap surface of the first sealing gap, opposing a pair of trapezoid oblique side sections of the connector housing, and with a third sealing concave surface section, which constitutes a cover-side gap surface of the third sealing gap, opposing the base;

a second sealing concave surface section is provided on the long bottom side of the connector housing, which forms the second sealing gap, opposing the base, and the second sealing concave surface section and the third sealing concave surface section communicate with each other to form a concave surface section of an annular sealing gap;

the cover is further provided with overlap reservoirs into which part of the waterproof sealing material flows, and with replenishing inclined surface sections that are provided in trapezoid oblique side sections of the cover and that are parallel to the first sealing concave surface sections, at a connection and merging position of the first sealing concave surface sections and the third sealing concave surface section; and the waterproof sealing material for the first sealing gap is applied turning around at a first sealing gap surface and the replenishing inclined surface sections of the cover, via the overlap reservoirs.

2. The waterproof-type control unit according to claim 1, wherein the overlap reservoirs include an outer overlap reservoir and an inner overlap reservoir configured by widening of the concave surface width of the third sealing concave surface section, at the connection and merging position of the first sealing concave surface sections and the third sealing concave surface section;

the inner overlap reservoir is a shelf or sloping passage through which there passes a U-shaped turn-back portion of the waterproof sealing material that fills the first sealing gap; and a replenishing end section of the waterproof sealing material is applied to the replenishing inclined surface sections, which are part of the trapezoid oblique side sections, by turning around at the inner overlap reservoir.

3. The waterproof-type control unit according to claim 2, wherein in the connection and merging position, the center lines of the first sealing concave surface sections are provided further inward than the center line of the third sealing concave surface section to be mutually connected; and the depth of the outer overlap reservoir is equal to or greater than the depth of the third sealing concave surface section.

4. The waterproof-type control unit according to claim 2, wherein an assembly relative position of the connector housing and the cover is regulated by mutual fitting of a pair of fitting holes, provided in one of the connector housing, and the cover and positioning protrusions provided in the other; and a cover-side pair of gap-regulating walls or a connector housing-side pair of gap-regulating walls is provided in either one of a pair of trapezoid oblique side sections of the cover and a pair of trapezoid oblique side sections of the connector housing that make up part of the first sealing gap, the gap-regulating walls being disposed parallelly to the inner side of the replenishing inclined surface sections.

5. The waterproof-type control unit according to claim 1, wherein first protrusions and third protrusions are provided in the first sealing gap and the third sealing gap;

the first protrusions, which are provided at one of opposing surfaces of the lateral opening of the cover and the short top side section of the connector housing, are gap-setting protrusions that prevent the first sealing gap from being excessively small;

the third protrusions, which are provided at one of opposing surfaces of the three outer peripheral sides of the cover and the base, are gap-setting protrusions that prevent the third sealing gap from becoming excessively small;

upon fastening and clamping of the circuit board by the cover and the base, the third protrusions that regulate the third sealing gap abut opposing surfaces of the cover and the base, in a state where part of the curved dimension of the circuit board having undergone curving deformation is straightened through compression of the circuit board, and the gap dimension of the third sealing gap is determined by the height dimension of the gap-setting protrusion.

6. A method for assembling the waterproof-type control unit according to claim 1, the method comprising:

a first process step of mounting a cover, in a flipped state, on a jig, and applying a paste-like waterproof sealing material, which is divided into a first sealing material and a second sealing material, onto a seal surface that makes up a first sealing gap of the cover, in a non-annular fashion;

a second process step of mounting a circuit board, on which circuit components and a connector housing are mounted beforehand and which have undergone mounting soldering, on an installation shelf stepped portion provided on three sides of the outer periphery of the cover, to join thereby the connector housing and the cover;

a third process step of applying a paste-like waterproof sealing material, in a ring-like fashion, onto seal surfaces that make up a third sealing gap of the cover and a second sealing gap of the connector housing, which have completely undergone the second process step; and a fourth process step of mounting a base on the cover having completely undergone the third process step, integrally fixing the cover and the base, and clamping and fixing the circuit board with three outer peripheral sides of the cover and the base, wherein the first and second sealing materials are applied turning around in a U-shape, with an intermediate portion of a trapezoid short top side section in a lateral opening of the cover as a start point or end point, and with replenishing inclined surface sections that are parallel to first sealing concave surface sections provided in a pair of trapezoid oblique side sections, as an end point or start point; and after the fourth process step is over, the paste-like waterproof sealing material is dried and cured by being left to stand at normal temperature or through heating, while performing visual inspection and performance inspection.

7. The method for assembling a waterproof-type control unit according to claim 6, wherein in the third process step, a beginning and a terminal of an annular sealing material, which is the waterproof sealing material that is applied in an ring-like fashion, are provided in the third sealing gap;

a board cutout is provided in the circuit board; and the board cutout is provided at an adjacent position of the beginning and the terminal of the annular sealing material, and constitutes an overlap reservoir into which excess sealing material at an overlap portion flows, upon mounting of the base in the fourth step.

8. The method for assembling a waterproof-type control unit according to claim 6, wherein
- as the circuit component, the circuit board has an inner surface circuit component that is mounted on a face of the circuit board opposing the cover, or an outer surface circuit component that is mounted on a face of the circuit board opposing the base;
- when the base has a first heat-transfer seat adjacent to a rear face of the inner surface circuit component or a second heat-transfer seat adjacent to the outer surface circuit component,
- the second process step comprises
- an additional process step of applying a paste-like thermally conductive adhesive to the surface of the circuit board or the surface of the outer surface circuit component, opposing the first or second heat-transfer seat, or comprises
- a preliminary process step of applying a paste-like thermally conductive adhesive to the surface of the first or second heat-transfer seat, prior to the fourth process step;

the base is an a high thermal conductivity member made of sheet metal or by aluminum die-casting, and the cover is made of sheet metal or of a resin;

in a trapezoidal short top side section of the lateral opening of the cover, there is formed: a first sealing cover top side section having a terrace-like inclined surface section or being an extension of the first sealing concave surface sections, while in the short top side section of the connector housing there is formed a first sealing top side section having a terrace-like inclined surface section or being an extension of first sealing convex surface sections provided in the trapezoid oblique side sections of the connector housing, and the first sealing top side section makes up part of the first sealing gap opposing the first sealing cover top side section; and an enclosed space configured by the base, the connector housing and the cover communicates with outside air via a waterproof filter having porous vent holes and being impervious to water.

* * * * *